US012665164B2

(12) United States Patent
Slot et al.

(10) Patent No.: US 12,665,164 B2
(45) Date of Patent: Jun. 23, 2026

(54) ALIGNMENT DETERMINATION METHOD AND COMPUTER PROGRAM

(71) Applicant: ASML Netherlands B.V., Veldhoven (NL)

(72) Inventors: Erwin Slot, Zoetermeer (NL); Niels Vergeer, Rotterdam (NL); Vincent Sylvester Kuiper, Monster (NL)

(73) Assignee: ASML Netherlands B.V., Veldhoven (NL)

( * ) Notice: Subject to any disclaimer, the term of this patent is extended or adjusted under 35 U.S.C. 154(b) by 673 days.

(21) Appl. No.: 18/088,499

(22) Filed: Dec. 23, 2022

(65) Prior Publication Data

US 2023/0207259 A1     Jun. 29, 2023

(51) Int. Cl.
H01J 37/304          (2006.01)
H01J 37/28           (2006.01)

(52) U.S. Cl.
CPC .......... H01J 37/3045 (2013.01); H01J 37/28 (2013.01); H01J 2237/1501 (2013.01)

(58) Field of Classification Search
CPC .................. H01J 37/3045; H01J 37/28; H01J 2237/1501; H01J 2237/0453;
(Continued)

(56) References Cited

U.S. PATENT DOCUMENTS 8,143,588 B2 * 3/2012 Nagae ................. H01J 37/3174
                                                         250/398
9,653,254 B2 * 5/2017 Zeidler ................. B82Y 10/00
(Continued)

FOREIGN PATENT DOCUMENTS

CN          117836892 A  *  4/2020   ............ H01J 37/026
EP            2317535 A2  *  5/2011   ............. H01J 37/28
(Continued)

OTHER PUBLICATIONS

S. Tanimoto, et al., "Inspection of all beams in multielectron beam system", Journal of Vacuum Science and Technology: Part B, AVS / AIP, Melville, New York, NY, US, vol. 25, No. 2, Mar. 5, 2007 (Mar. 5, 2007), pp. 380-386, XP012102854, ISSN: 1071-1023, DOI:10.1116/1.2647279.

(Continued)

*Primary Examiner* — David A Vanore
(74) *Attorney, Agent, or Firm* — FINNEGAN, HENDERSON, FARABOW, GARRETT & DUNNER, LLP

(57)          ABSTRACT

The present invention concerns a method of determining alignment of electron optical components in a charged particle apparatus. The charged particle apparatus comprising: an aperture array and a detector configured to detect charged particles corresponding to beamlets that pass through the corresponding apertures in the aperture array. The method comprises: scanning each beamlet in a plane of the aperture array over a portion of the aperture array in which a corresponding aperture of the aperture array is defined so that charged particles of each beamlet may pass through the corresponding aperture; detecting during the scan any charged particles corresponding to each beamlet that passes through the corresponding aperture; generating a detection pixel for each beamlet based on the detection of charged particles corresponding to each beamlet at intervals of the scan; and collecting information comprised in the detection pixel such as the intensity of charged particles.

17 Claims, 12 Drawing Sheets

(58) Field of Classification Search
CPC ... H01J 2237/24495; H01J 2237/24514; H01J
2237/28; H01J 2237/2826; H01J
2237/31774; H01J 37/1471
See application file for complete search history.

(56) References Cited

U.S. PATENT DOCUMENTS

| | | | | |
|---|---|---|---|---|
| 9,653,259 | B2 * | 5/2017 | Scheffers ............... | G01B 11/14 |
| 12,125,671 | B2 * | 10/2024 | Steenbrink ............ | H01J 37/141 |
| 2009/0114818 | A1 * | 5/2009 | Casares ................... | H01J 37/09 |
| | | | | 250/306 |
| 2010/0148087 | A1 * | 6/2010 | Doering ................. | B82Y 40/00 |
| | | | | 250/396 R |
| 2012/0175527 | A1 * | 7/2012 | De Boer ............... | H01J 37/185 |
| | | | | 250/492.1 |
| 2015/0109601 | A1 * | 4/2015 | Scheffers ............... | B82Y 40/00 |
| | | | | 355/74 |
| 2015/0155136 | A1 * | 6/2015 | Scheffers ............ | H01J 37/3045 |
| | | | | 250/206.1 |
| 2016/0071696 | A1 * | 3/2016 | Kuiper ................ | H01J 37/3177 |
| | | | | 250/396 R |
| 2020/0211814 | A1 * | 7/2020 | Van Der Toorn ..... | H01J 37/304 |
| 2020/0381211 | A1 * | 12/2020 | Ren ........................ | H01J 37/145 |
| 2021/0384008 | A1 * | 12/2021 | Li ............................ | H01J 37/10 |
| 2022/0246395 | A1 * | 8/2022 | Ren ........................ | H01J 37/28 |
| 2023/0005706 | A1 * | 1/2023 | Mangnus ................ | H01J 37/28 |
| 2023/0207259 | A1 * | 6/2023 | Slot ..................... | H01J 37/3045 |
| | | | | 250/491.1 |
| 2023/0324318 | A1 * | 10/2023 | Ren ......................... | H01J 37/12 |
| | | | | 250/252.1 |
| 2024/0014003 | A1 * | 1/2024 | Li ............................ | H01J 37/28 |
| 2024/0128045 | A1 * | 4/2024 | Slot ..................... | H01J 37/1477 |
| 2024/0128051 | A1 * | 4/2024 | Zeidler ................. | H01J 37/244 |
| 2024/0136147 | A1 * | 4/2024 | Slot ........................ | H01J 37/141 |
| 2024/0145208 | A1 * | 5/2024 | Slot ........................ | H01J 37/28 |
| 2024/0331968 | A1 * | 10/2024 | Ren ........................ | H01J 37/244 |
| 2024/0331971 | A1 * | 10/2024 | Van Soest ............... | H01J 37/20 |
| 2024/0339290 | A1 * | 10/2024 | Van Soest .......... | H01J 37/3045 |
| 2024/0371596 | A1 * | 11/2024 | Mueller ................. | H01J 37/10 |
| 2025/0095133 | A1 * | 3/2025 | Kuiper ................. | G06T 7/0006 |
| 2025/0118528 | A1 * | 4/2025 | Wieland ................. | H01J 37/28 |
| 2025/0253123 | A1 * | 8/2025 | Van Engelen ...... | H01J 37/3177 |

FOREIGN PATENT DOCUMENTS

| | | | | | |
|---|---|---|---|---|---|
| EP | | 4202970 A1 * | 6/2023 | ......... | H01J 37/3045 |
| JP | | 2005-347054 A | 12/2005 | | |
| TW | | 201942942 A | 11/2019 | | |
| TW | | 202136762 A | 10/2021 | | |
| WO | WO-2025056308 A1 * | | 3/2025 | ............. | H01J 37/28 |

OTHER PUBLICATIONS

C. Van Den Berg, et al, "Scanning exposures with a MAPPER multibeam system", Alternative Lithographic Technologies III, Proc. of SPIE vol. 7970, 79700D,© 2011 SPIE, CCC code: 0277-786X/11/$18, doi: 10.1117/12.881572.

J. Belledent, et al, "Matching of beams on the MAPPER MATRIX tool: a simulation study", Alternative Lithographic Technologies V, Proc. of SPIE vol. 8680, 86800J,© 2013 SPIE, CCC code: 0277-786X/13/$18, doi: 10.1117/12.2011500.

* cited by examiner

Fig. 4
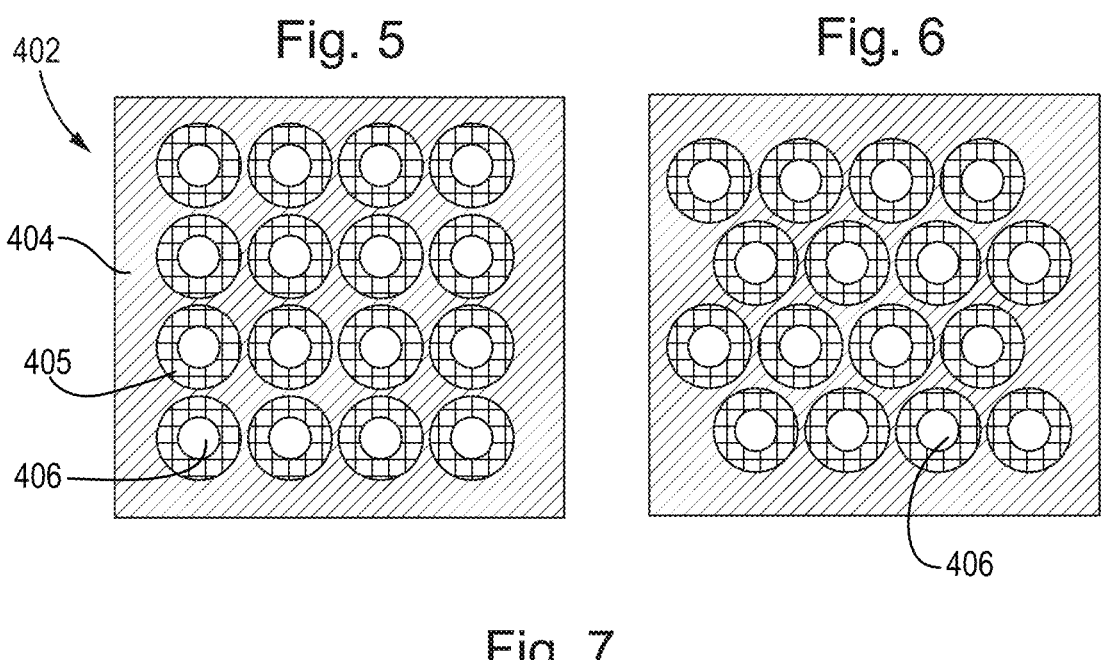
Fig. 5          Fig. 6
Fig. 7
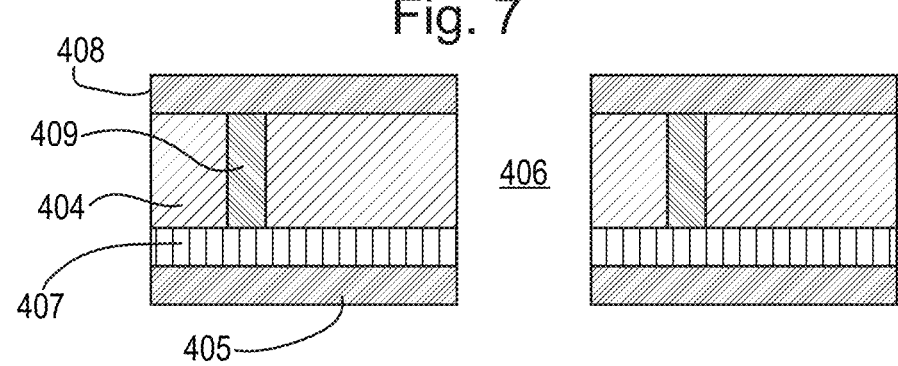

ALIGNMENT DETERMINATION METHOD AND COMPUTER PROGRAM

CROSS-REFERENCE TO RELATED PATENT APPLICATIONS

This application claims priority of EP application 21217750.5, which was filed on 24 Dec. 2021. The aforementioned application is incorporated herein by reference in its entirety.

FIELD

The embodiments provided herein generally relate to a method and a computer program for determining alignment of electron optical components operable on a plurality of beamlets in a charged particle apparatus.

BACKGROUND

When manufacturing semiconductor integrated circuit (IC) chips, undesired pattern defects often occur on a substrate (i.e. wafer) or a mask during the fabrication processes, thereby reducing the yield. Such defects can occur as a consequence of, for example, optical effects and incidental particles as well as in subsequent processing steps such as etching, deposition or chemical mechanical polishing. Monitoring the extent of the undesired pattern defects is therefore an important process in the manufacture of IC chips. More generally, the inspection and/or measurement (or together assessment) of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam (or primary beam) of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause signal electrons to be emitted from the surface, such as secondary electrons, backscattered electrons or Auger electrons. The generated signal electrons may be emitted from the material structure of the sample. By scanning the primary beam as the probing spot over the sample surface, signal electrons (or signal particles) can be emitted across the surface of the sample. By collecting these emitted signal electrons (or signal particles) from the sample surface, a pattern inspection tool may obtain an image representing characteristics of the material structure of the surface of the sample.

There is a general need to improve the throughput and other characteristics of a charged particle assessment apparatus. In particular, the alignment of various elements of a charged particle assessment apparatus must be determined and corrected if required. This is a time consuming process that needs to be improved.

SUMMARY

The embodiments provided herein disclose a method and a computer program for determining alignment of electron optical components operable on a plurality of beamlets in a charged particle apparatus.

According to some embodiments of the present disclosure, there is provided a method of determining alignment of electron optical components operable on a plurality of beamlets in a charged particle apparatus comprising: an aperture array and a detector configured to detect charged particles corresponding to the beamlets that pass through the corresponding apertures in the aperture array, the detector positioned downbeam along the paths of the beamlets relative to the aperture array, the method comprising:

scanning each beamlet in a plane of the aperture array over a portion of the aperture array in which a corresponding aperture of the aperture array is defined so that charged particles of each beamlet may pass through the corresponding aperture;

detecting during the scan any charged particles corresponding to each beamlet that passes through the corresponding aperture;

generating a detection pixel for each beamlet based on the detection of charged particles corresponding to each beamlet at intervals of the scan; and collecting information comprised in the detection pixel such as the intensity of charged particles.

According to some embodiments of the present disclosure, there is provided a computer program comprising instructions for determining alignment of electron optical components operable on a plurality of beamlets in a charged particle apparatus comprising: an aperture array and a detector configured to detect charged particles corresponding to the beamlets that pass through the corresponding apertures in the aperture array, the detector positioned downbeam along the paths of the beamlets relative to the aperture array, the computer program comprising instructions configured to:

control the charged particle apparatus to scan each beamlet in a plane of the aperture array over a portion of the aperture array in which a corresponding aperture of the aperture array is defined so that charged particles of each beamlet may pass through the corresponding aperture;

control the charged particle apparatus to detect during the scan any charged particles corresponding to each beamlet that passes through the corresponding aperture;

generate a detection pixel for each beamlet based on the detection of charged particles corresponding to each beamlet at intervals of the scan; and collect information comprised in the detection pixel such as the intensity of charged particles.

BRIEF DESCRIPTION OF FIGURES

The above and other aspects of the present disclosure will become more apparent from the description of exemplary embodiments, taken in conjunction with the accompanying drawings.

FIG. 4 is a schematic cross-sectional view of an objective lens of an assessment apparatus according to some embodiments.

FIG. 5 is a bottom view of the objective lens of FIG. 4.

FIG. 6 is a bottom view of a modification of the objective lens of FIG. 4.

FIG. 7 is an enlarged schematic cross-sectional view of a detector incorporated in the objective lens of FIG. 4.

DETAILED DESCRIPTION

Figure 1:
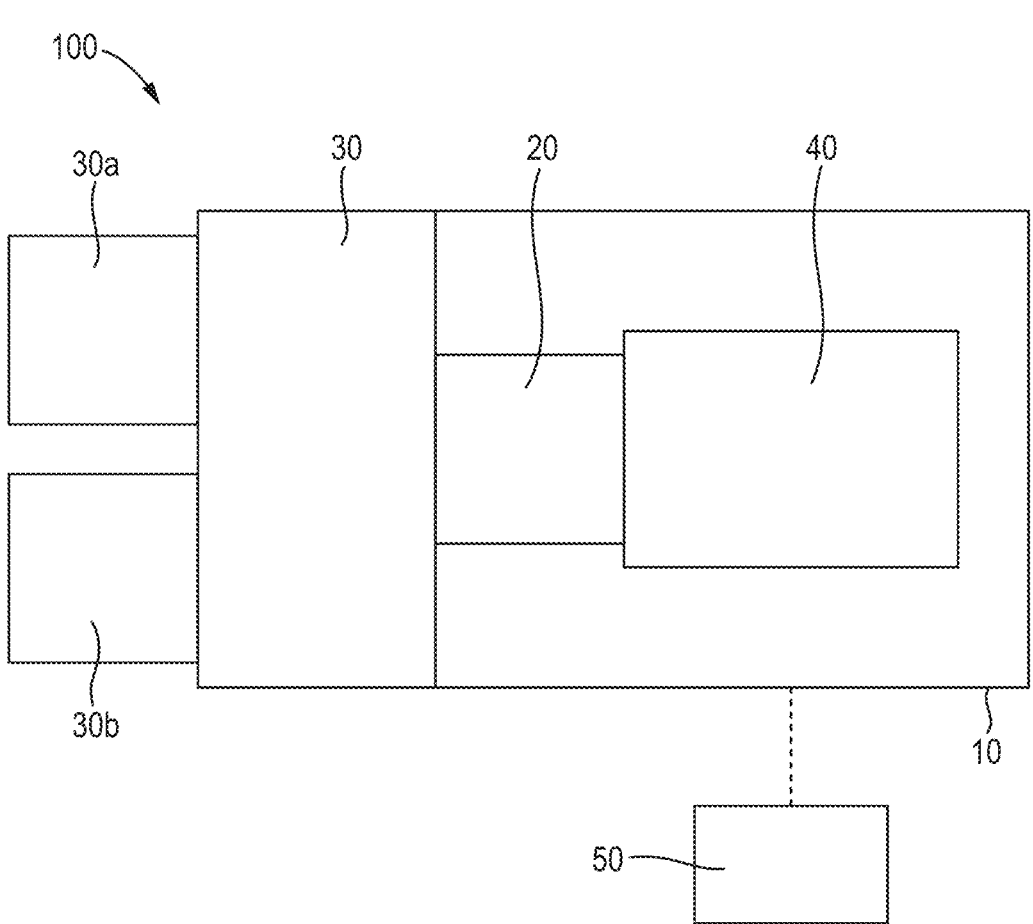
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than $\frac{1}{1000}$th of a human hair. Thus, it is not surprising that semiconductor IC manufacturing is a complex and time-consuming process, with hundreds of individual steps. Errors in even one step have the potential to dramatically affect the functioning of the final product. Just one defect can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by assessment tools (such as a Scanning Electron Microscope (SEW)) is essential for maintaining high yield and low cost.

A SEM comprises a scanning device and a detector device. The scanning device comprises an illumination apparatus that comprises an electron source, for generating primary electrons for example in a source beam (or primary beam), and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detector device captures the secondary electrons from the sample as the sample is scanned so that the SEM can create an image of the scanned area of the sample. The detector device may comprise semiconductor elements such as PIN detector elements, charge detector elements such as capture electrodes and/or electron to phone converter elements such as scintillators. For high throughput inspection, some of the assessment apparatuses use multiple focused beams, i.e. a multi-beam, of primary electrons. The component beams of the multi-beam may be referred to as sub-beams or beamlets. A multi-beam can scan different parts of a sample simultaneously. A multi-beam assessment apparatus can therefore inspect a sample at a much higher speed than a single-beam assessment apparatus.

An implementation of a known multi-beam assessment apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam assessment apparatus 100. The charged particle beam assessment apparatus 100 (or charged particle beam apparatus 100) of FIG. 1 includes a main chamber 10, a load lock chamber 20, an electron beam tool 40, an equipment front end module (EFEM) 30 and a controller 50. Electron beam apparatus 40 is located within main chamber 10.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam apparatus 40 may comprise a multi-beam electron-optical apparatus.

Controller 50 is electronically connected to electron beam apparatus 40. Controller 50 may be a processor (such as a computer) configured to control the charged particle beam apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam assessment apparatus or it can be distributed over at least two of the component elements. While the present disclosure provides examples of main chamber 10 housing an electron beam assessment tool, it should be noted that aspects of the disclosure in their broadest sense are not limited to a chamber housing an electron beam assessment tool. Rather, it is appreciated that the foregoing principles may also be applied to other tools and other arrangements of apparatus, that operate under the second pressure.

Figure 2:
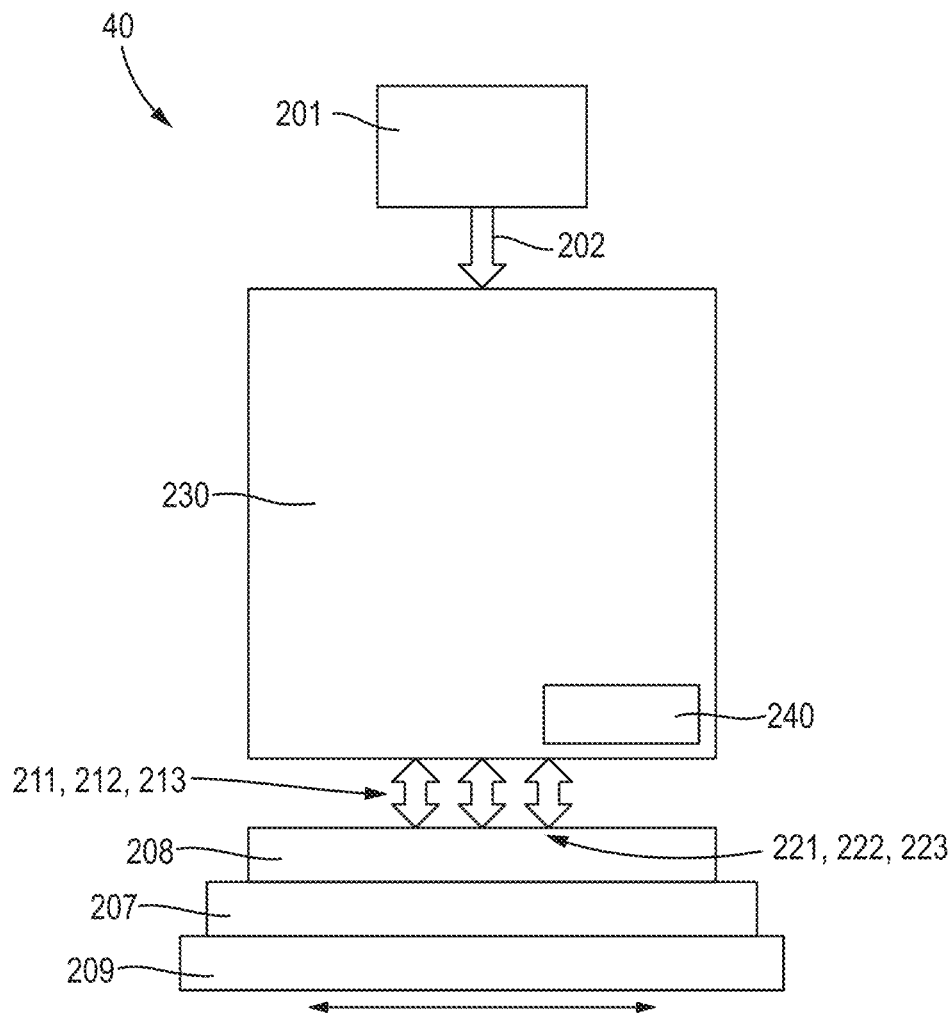
FIG. 2 is a schematic diagram illustrating an exemplary multi-beam apparatus that is part of the exemplary charged particle beam assessment apparatus of FIG. 1.

Reference is now made to FIG. 2, which is a schematic diagram illustrating an exemplary electron beam apparatus 40 including a multi-beam assessment tool that is part of the exemplary charged particle beam assessment apparatus 100 of FIG. 1. Multi-beam electron beam apparatus 40 (also referred to herein as tool 40) comprises an electron source 201, a projection apparatus 230, an actuated stage 209, and a sample holder 207 (which may also be referred to as a sample support). The electron source 201 and projection apparatus 230 may together be referred to as an illumination apparatus. The sample holder 207 is supported by actuated stage 209 so as to hold a sample 208 (e.g., a substrate or a mask) for inspection. Multi-beam electron beam apparatus 40 further comprises a detector device (e.g. an electron detection device 240).

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary beam 202.

Projection apparatus 230 is configured to convert primary beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

Controller 50 may be connected to various parts of charged particle beam assessment apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam assessment apparatus, including the charged particle multi-beam apparatus.

Projection apparatus 230 may be configured to focus sub-beams 211, 212, and 213 onto a sample 208 for assessment and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons. The secondary electrons typically have electron energy ≤50 eV and backscattered electrons typically have electron energy between 50 eV and the landing energy of primary sub-beams 211, 212, and 213.

Electron detection device 240 is configured to detect secondary electrons and/or backscattered electrons (also known as signal particles) and to generate corresponding signals which are sent to controller 50 or a signal processing system (not shown), e.g. to construct images of the corresponding scanned areas of sample 208. Desirably, electron detection device is incorporated into the projection apparatus. Alternatively it may be separate therefrom, with a secondary electron-optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions. The image acquirer may be configured to perform adjustments of brightness and contrast, etc. of acquired images. The storage may be any suitable storage medium. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control actuated stage 209 to move sample 208 during assessment of sample 208. The controller 50 may enable actuated stage 209 to move sample 208 in one or more selected directions, continuously or discontinuously. In some arrangements, the movement may be performed at a constant speed. The movement of the sample 208 may be referred to as scanning. This scanning may therefore be continuous or discontinuous. The controller 50 may control movement of the actuated stage 209 so that it changes the speed of the movement of the sample 208 dependent on various parameters. For example, the controller may control the stage speed (including its direction) depending on the characteristics of the assessment steps of scanning process.

Figure 3:
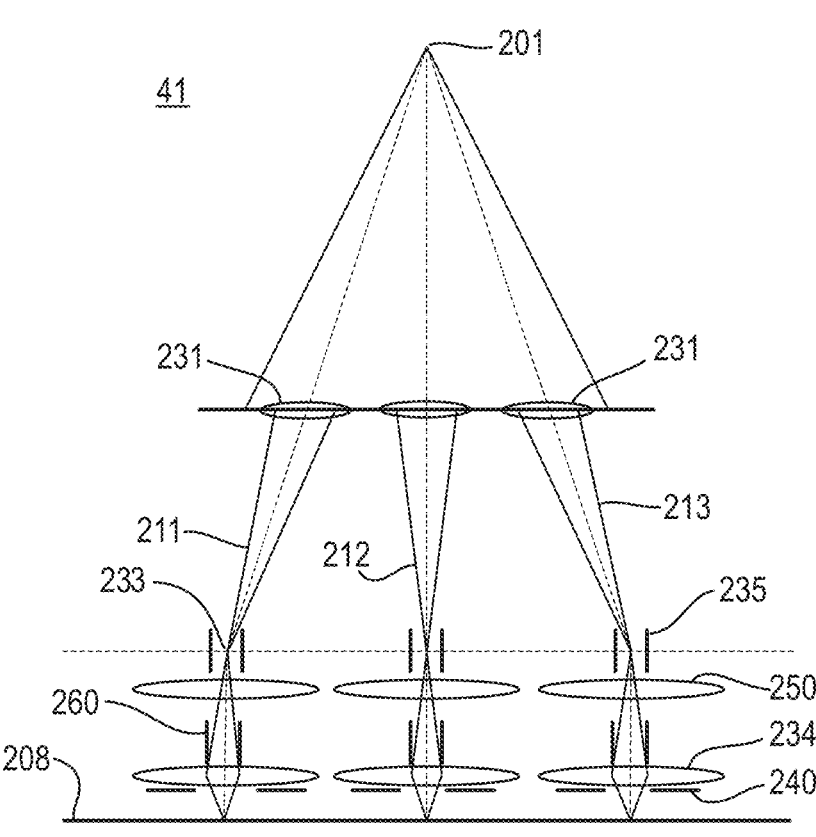
FIG. 3 is a schematic diagram of exemplary multi-beam apparatus according to some embodiments.

FIG. 3 is a schematic diagram of an assessment tool comprising an electron source 201 and an electron optical column (or electron optical device). (In another arrangement the source is part of the electron-optical column). The electron optical device comprises a plurality of electron optical elements. An electron optical element is any element that affects (e.g. directs, shapes or focuses) an electron beam and may use electric and/or magnetic fields. Electron source 201 directs electrons toward an array of condenser lenses 231 forming part of the electron optical column. The electron source is desirably a high brightness thermal field emitter with a good compromise between brightness and total emission current. There may be many tens, many hundreds or many thousands of condenser lenses 231. Condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The condenser lens array therefore functions as a beam divider, beam splitter, beam generator or beam separator. The condenser lens array may take the form of at least two plates, acting as electrodes, with an aperture in each plate aligned with each other and corresponding to the location of a path of a sub-beam. At least two of the plates are maintained during operation at different potentials to achieve the desired lensing effect. The plates therefore have an array of apertures, each aperture corresponding to the path of a sub-beam. The plate positioned most upbeam is the beam separator and may referred to as a beam limiting aperture. In a different arrangement the beam separator may be part of or associated with the condenser lens array, with a separate function form lensing the sub-beams.

In an arrangement the condenser lens array is formed of three plate arrays in which charged particles have the same energy as they enter and leave each lens, which arrangement may be referred to as an Einzel lens. The beam energy is the same on entering as leaving the Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

Each condenser lens in the array directs electrons into a respective sub-beam 211, 212, 213 which is focused at a respective intermediate focus 233. The sub-beams diverge with respect to each other. At the intermediate focuses 233 are deflectors 235. The deflectors 235 are positioned in the beamlet paths at, or at least around, the position of the corresponding intermediate focusses 233 or focus points (i.e. points of focus). The deflectors are positioned in the beamlet paths at the intermediate image plane of the associated beamlet, i.e. at its focus or focus point. The deflectors 235 are configured to operate on the respective beamlets 211, 212, 213. Deflectors 235 are configured to bend a respective beamlet 211, 212, 213 by an amount effective to ensure that the principal ray (which may also be referred to as the beam axis) is incident on the sample 208 substantially normally (i.e. at substantially 90° to the nominal surface of the sample). Deflectors 235 may also be referred to as collimators or collimator deflectors. The deflectors 235 in effect collimate the paths of the beamlets so that before the deflectors, the beamlets paths with respect to each other are diverging. Downbeam of the deflectors the beamlet paths are substantially parallel with respect to each other, i.e. substantially collimated. Suitable collimators are deflectors disclosed in EP Application 20156253.5 filed on 7 Feb. 2020 which is hereby incorporated by reference with respect to the application of the deflectors to a multi-beam array.

Below (i.e. downbeam or further from source 201) deflectors 235 there is a control lens array 250 comprising a control lens 251 for each sub-beam 211, 21, 213. Control lens array 250 may comprise at least two, for example three, plate electrode arrays connected to respective potential sources. A function of control lens array 250 is optimize the beam opening angle with respect to the demagnification of the beam and/or to control the beam energy delivered to objective lenses 234, each of which directs a respective sub-beam 211, 212, 213 onto the sample 208. The objective lenses 234 are in an objective lens array 241. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array and the objective lens array operate together to provide a combined focal length. Combined operation without an intermediate focus may reduce the risk of aberrations. Note that the reference to demagnification and opening angle is intended to refer to variation of the same parameter. In an ideal arrangement the product of demagnification and the corresponding opening angle is constant over a range of values.

The control lens array 250 may be considered as providing electrodes additional to the electrodes of the objective lens array for example. The objective lens array may have any number of additional electrodes associated and proximate to the objective lens array. The additional electrodes such as of the control lens array 250 allow further degrees of freedom for controlling the electron-optical parameters of the sub-beams. Such additional associated electrodes may be considered to be additional electrodes of the objective lens array enabling additional functionality of the respective objective lenses of the objective lens array. In an arrangement such electrodes may be considered part of the objective lens array providing additional functionality to the objective lenses of the objective lens array. Thus, the control lens is considered to be part of the corresponding objective lens, even to the extent that the control lens is only referred to as being a part of the objective lens.

The objective lenses 234 are arranged in an objective lens array such as the objective lens array 241. Objective lenses 234 can be configured to demagnify the electron beam by a factor greater than 10, desirably in the range of 50 to 100 or more. The objective lenses 234 may be Einzel lenses. At least the chromatic aberrations generated in a beam by a condenser lens and the corresponding downbeam objective lens may mutually cancel.

Each plate electrode of the objective lens array is desirably mechanically connected to, and electrically separated from, an adjacent plate electrode array by an isolating element, such as a spacer which may comprise ceramic or glass. Such a spacer may mechanically connect adjacent electrode plates and electrically isolate the adjacent electrode plates. The isolating element may otherwise be referred to as an insulating structure and may be provided to separate any adjacent electrodes provided. If more than two electrodes are provided, multiple isolating elements (i.e. insulating structures) may be provided. For example, there may be a sequence of insulating structures. The isolating spacer may be present between any other electron-optical elements of the electron optical device 240.

An electron detection device 240 is provided between the objective lenses 234 and the sample 208 to detect secondary and/or backscattered electrons emitted from the sample 208. An exemplary construction of the electron detection system is described below.

Optionally an array of scan deflectors 260 is provided between the control lens array 250 and the array of objective lenses 234. The array of scan deflectors 260 comprises a scan deflector 261 for each sub-beam 211, 212, 213. Each scan deflector is configured to deflect a respective sub-beam 211, 212, 213 in one or two directions so as to scan the sub beam across the sample 208 in one or two directions.

The system of FIG. 3 can be configured to control the landing energy of the electrons on the sample. The landing energy can be selected to increase emission and detection of secondary electrons dependent on the nature of the sample being assessed. A controller provided to control the objective lenses 234 may be configured to control the landing energy by varying the potentials applied to the electrodes of the control lenses and the objective lenses. The control lenses and objective lenses work together and may be referred to as an objective lens assembly. The landing energy can be selected to increase emission and detection of secondary electrons dependent on the nature of the sample being assessed. A controller may be configured to control the landing energy to any desired value within a predetermined range or to a desired one of a plurality of predetermined values. In some embodiments, the landing energy can be controlled to desired value in the range of from 1000 eV to 5000 eV.

Desirably, the landing energy is primarily varied by controlling the energy of the electrons exiting the control lens. The potential differences within the objective lenses are desirably kept constant during this variation so that the electric field within the objective lens remains as high as possible. The potentials applied to the control lens in addition may be used to optimize the beam opening angle and demagnification. The control lens can also be referred to as a refocus lens as it can function to correct the focus position in view of changes in the landing energy. The use of the control lens array enables the objective lens array to be operated at its optimal electric field strength. Details of electrode structures and potentials that can be used to control landing energy are disclosed in EPA 20158804.3, which document is incorporated herein by reference.

The landing energy of the electrons may be controlled in the system of FIG. 4 because any off-axis aberrations generated in the beamlet path are generated in, or at least mainly in, the condenser lenses 231. The objective lenses 234 of the system shown in FIG. 3 need not be Einzel lenses. This is because, as the beams are collimated, off-axis aberrations would not be generated in the objective lenses. The off-axis aberrations can be controlled better in the condenser lenses than in the objective lenses 234.

In some embodiments, the charged particle assessment tool further comprises one or more aberration correctors that reduce one or more aberrations in the sub-beams. In some embodiments, each of at least a subset of the aberration correctors is positioned in, or directly adjacent to, a respective one of the intermediate foci (e.g. in or adjacent to the intermediate image plane). The sub-beams have a smallest sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In some embodiments, aberration correctors positioned in, or directly adjacent to, the intermediate foci (or intermediate image plane or focus points) comprise deflectors to correct for the source 201 appearing to be at different positions for different beams. Correctors can be used to correct macroscopic aberrations resulting from the source that prevent a good alignment between each sub-beam and a corresponding objective lens. In some circumstances it is desirable to position the correctors as far upbeam as possible. In this way, a small angular correction can effect a large displacement at the sample so that weaker correctors can be used. Desirably the correctors are positioned to minimize introduction of additional aberrations. Additionally or alternatively other non-uniformities in the primary beam may be corrected; that is aberrations in the primary beam uniformity may be corrected.

The aberration correctors may correct other aberrations that prevent a proper column alignment. Such aberrations may also lead to a misalignment between the sub-beams and the correctors. For this reason, it may be desirable to additionally or alternatively position aberration correctors at or near the condenser lenses 231 (e.g. with each such aberration corrector being integrated with, or directly adjacent to, one or more of the condenser lenses 231). This is desirable because at or near the condenser lenses 231 aberrations will not yet have led to a shift of corresponding sub-beams because the condenser lenses 231 are vertically close or coincident with the beam apertures. That is, correction by the corrector of any angular error will require a smaller positional shift than if the corrector is positioned further downbeam. Correcting such aberrations further downbeam such as at the intermediate foci may be impacted by misalignment between the sub-beams 211, 212, 213 and the correctors. A challenge with positioning correctors at or near the condenser lenses 231, however, is that the sub-beams each have relatively large sectional areas and relatively small pitch at this location, relative to locations further downbeam. In situations with volume restrictions, the corrector array or additional corrector arrays may be located away from these preferred locations, such as between the condenser lens array and the intermediate focus positions.

The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference. There may be an aberration corrector of this design for each beamlet, i.e. an individual beamlet corrector. The individual beamlet correctors may be in an array across the multi-beam, which may be referred to as a corrector array.

In some embodiments the objective lens array referred to in earlier embodiments is an array objective lens. Each element in the array is a micro-lens operating a different beam or group of beams in the multi-beam. An electrostatic array objective lens has at least two plates each with a plurality of holes or apertures. The position of each hole in a plate corresponds to the position of a corresponding hole in the other plate. The corresponding holes operate in use on the same beam or group of beams in the multi-beam. A suitable example of a type of lens for each element in the array is a two electrode decelerating lens. Each electrode may in its own right be considered as a lens; each electrode may be considered an electron-optical element.

The bottom electrode of the objective lens is a CMOS chip detector integrated into a multi-beam manipulator array. Integration of a detector array into the objective lens replaces a secondary column of other electron-optical designs. The CMOS chip is desirably orientated to face the sample (because of the small distance (e.g. 100 μm) between sample and bottom of the electron-optical system). In some embodiments, charged based detector elements such as capture electrodes to capture the secondary electron signals are provided. The capture electrodes can be formed in the metal layer of, for example, a CMOS device. The capture electrode may form the bottom layer of the objective lens. The capture electrode may form the bottom surface in a CMOS chip. The CMOS chip may be a CMOS chip detector. The CMOS chip may be integrated into the sample facing surface of an objective lens assembly. The capture electrodes are examples of sensor units for detecting secondary electrons. The capture electrodes can be formed in other layers. Power and control signals of the CMOS may be connected to the CMOS by through-silicon vias. For robustness, desirably the bottom electrode consists of two elements: the CMOS chip and a passive Si plate with holes. The plate shields the CMOS from high E-fields.

Sensor units associated with bottom or sample facing surface of an objective lens are beneficial because the secondary and/or back-scatted electrons may be detected before the electrons encounter and become manipulated by an electron optical element of the electron-optical system. Beneficially the time taken for detection of such a sample emanating electron may be reduced desirably minimized.

In order to maximize the detection efficiency it is desirable to make the electrode surface as large as possible, so that substantially all the area of the array objective lens (excepting the apertures) is occupied by electrodes and each electrode has a diameter substantially equal to the array pitch. In some embodiments the outer shape of the electrode is a circle, but this can be made a square to maximize the detection area. Also the diameter of the through-substrate hole can be minimized. Typical size of the electron beam is in the order of 5 to 15 micron.

In some embodiments, a single charge detector element such as a capture electrode surrounds each aperture. In another example, a plurality of electrode elements is provided around each aperture. The electrode elements are examples of sensor elements. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller, especially if a larger electrode gives only a slightly larger detection efficiency, but a significantly larger crosstalk.

The signal particles e.g. back-scattered and/or secondary electrons collected by electrode as current is amplified. The purpose of the amplifier is to enable sufficiently sensitive measurement of the current received or collected by the sensor unit to be measured and thus the number of back-scattered and/or secondary electrons. This can be measured by current measurements or the potential difference over a resistor. Several types of amplifier design may be used to amplify back-scattered and/or secondary electron current collected by electrode for example a Trans Impedance Amplifier.

An example is shown in FIG. 4 which illustrates a multibeam objective lens 401 in schematic cross section. On the output side of the objective lens 401, the side facing the sample 208, a detector module 402 is provided. Detector module 402 is an example of an electron detection device. FIG. 5 is a bottom view of detector module 402 which comprises a substrate 404 on which are provided a plurality of capture electrodes 405 each surrounding a beam aperture 406. Beam apertures 406 are large enough not to block any of the primary beams. Capture electrodes 405 can be considered as examples of sensor units which receive back-scattered or secondary electrodes and generate a detection signal, in this case an electric current. Capture electrodes may be considered charge detector elements. The beam apertures 406 may be formed by etching through substrate 404. In the arrangement shown in FIG. 5, the beam apertures 406 are shown in a rectangular array. The beam apertures 406 can also be differently arranged, e.g. in a hexagonal close packed array as depicted in FIG. 6.

FIG. 7 depicts at a larger scale a part of the detector module 402 in cross section. Charge detector elements such as capture electrodes 405 form the bottommost, i.e. most close to the sample, surface of the detector module 402. In operation, the array of capture electrodes 405 face the sample 208. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In some embodiments, there is one amplifier and one analogue to digital converter per capture electrode 405. Logic layer 407 and capture electrodes 405 can be manufactured using a CMOS process with the capture electrodes 405 forming the final metallization layer.

A wiring layer 408 is provided on the backside of substrate 404 and connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector module 402.

FIG. 4 depicts a three-electrode objective lens, but it will be appreciated that any other form of objective lens with as many electrodes including associated electrodes as required, e.g. a two-electrode lens, may also be used.

Figure 8:
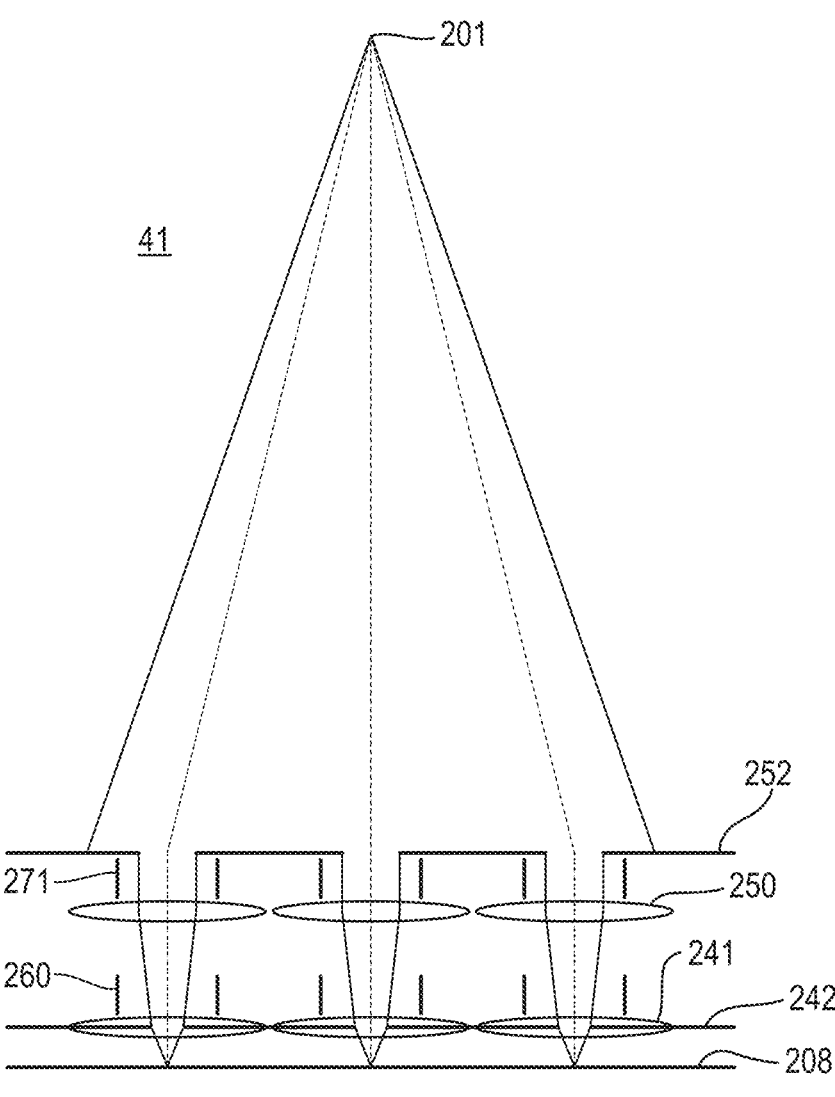
FIG. 8 is a schematic diagram of exemplary multi-beam apparatus according to some embodiments.

FIG. 8 is a schematic diagram of another design of exemplary electron-optical system. The electron-optical system may comprise a source 201 and electron-optical device comprising a plurality of electron optical elements; alternatively the electron-optical device comprises the source 201.) The electron optical column may comprise an objective array assembly as shown and described with respect to FIG. 3. Such an objective array assembly may feature a control lens array 250, an objective lens array 241, and a detector array. Although not shown in FIG. 8, the system may further comprise an electron detection device (such as electron detection device 240 shown in FIG. 3).

In the present arrangement depicted in FIG. 8 the objective lens array may also feature an upper beam limiter 252, a collimator element array 271, a scan deflector array 260, and a beam shaping limiter 242. (Note in a different arrangement the electron optical column comprises these features without them being arranged in a common lens assembly.) The source 201 provides a beam of charged particles (e.g. electrons). The multi-beam focused on the sample 208 is derived from the beam provided by the source 201. Sub-beams may be derived from the beam, for example, using a beam limiter defining an array of beam-limiting apertures, e.g. the upper beam limiter 252.

The upper beam limiter 252 defines an array of beam-limiting apertures and functions as a beam separator or sub-beam generator. The upper beam limiter 252 may comprise a plate (which may be a plate-like body) having a plurality of apertures. The upper beam limiter 252 forms the sub-beams from the beam of charged particles emitted by the source 201. Portions of the beam other than those contributing to forming the sub-beams may be blocked (e.g. absorbed) by the upper beam limiter 252 so as not to interfere with the sub-beams down-beam. The upper beam limiter 252 may be referred to as a sub-beam defining aperture array.

The collimator element array 271 is provided down-beam of the upper beam limiter. Each collimator element collimates a respective sub-beam. The collimator element array 271 may be formed to be spatially compact which may be achieved by MEMS processing. In some embodiments, exemplified in FIG. 3, the collimator element array 271 is the first deflecting or focusing electron-optical array element in the beam path down-beam of the source 201. In another arrangement, the collimator may take the form, wholly or partially, of a macro-collimator (not shown). Such a macro-collimator may be upbeam of the upper beam limiter 252. Thus the macro-collimator operates on the beam from the source before generation of the multi-beam. A magnetic lens may be used as the macro-collimator.

Down-beam of the collimator element array there is one or more additional electrodes such as the control lens array 250. The control lens array 250 comprises a plurality of control lenses. Each control lens comprises at least two electrodes (e.g. three electrodes) connected to respective potential sources. Any additional electrodes such as the control lens array 250 may comprise two or more (e.g. three) plate electrode arrays connected to respective potential sources. The control lens array 250 is associated with the objective lens array 241 (e.g. the two arrays are positioned close to each other and/or mechanically connected to each other and/or controlled together as an array unit). The control lens array 250 is positioned up-beam of the objective lens array 241. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams.

The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect rays in the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions.

In some embodiments, the scanning deflectors described in EP2425444, which document is hereby incorporated by reference in its entirety specifically in relation to scan deflectors, may be used to implement the scan-deflector array 260. The scan-deflector array 260 is positioned between the objective lens array 241 and the control lens array 250. In the example shown, the scan-deflector array 260 is provided instead of a macro scan deflector. A scan-deflector array 260 (e.g. formed using MEMS manufacturing techniques as mentioned above) may be more spatially compact than a macro scan deflector.

In other embodiments both a macro scan deflector and the scan-deflector array 260 are provided. In such an arrangement, the scanning of the sub-beams over the sample surface may be achieved by controlling the macro scan deflector and the scan-deflector array 260 together, desirably in synchronization.

The smaller movement over the beam shaping limiter results in a smaller part of each control lens being used. The control lenses thus have a smaller aberration contribution. To minimize, or at least reduce, the aberrations contributed by the control lenses the beam shaping limiter is used to shape beams downbeam from at least one electrode of the control lenses. This differs architecturally from a different type of charged particle device 41, such as shown in and described with respect to FIG. 3, in which a beam shaping limiter is provided only as an aperture array that is part of or associated with a first manipulator array in the beam path and commonly generates the multi-beams from a single beam from a source.

In the example of FIG. 8, a collimator element array 271 is provided instead of a macro collimator. Although not shown, it is possible to use a macro collimator in the example of FIG. 8, to provide some embodiments having a macro-collimator and a scan deflector array 260. Another variation may have a macro-collimator and a macro-scan deflector. It is also possible to have a variation of the example of FIG. 8 with a macro scan deflector and a collimator element array. Each collimator element collimates a respective sub-beam. The collimator element array 271 (e.g. formed using MEMS manufacturing techniques) may be more spatially compact than a macro collimator. Providing the collimator element array 271 and the scan-deflector array 260 together may therefore provide space saving. In such an example there may be no macro condenser lens or a condenser lens array. In this scenario the control lens therefore provides the possibility to optimize the beam opening angle and magnification for changes in landing energy.

As described above, multiple electron-optical components in an electron optical column (such as a multibeam SEM or multibeam lithographic machine) are typically required to create a plurality of beams. The electron-optical components form electron optical apertures, lenses, deflectors and perform other manipulations of the beams. These electron optical components may include MEMS elements and need to be aligned accurately to allow all beams to land on a target (for example a sample or a detector). MEMS elements which are in close proximity to each other can be stacked on top of each other and are relatively easy to align.

MEMS elements which need to be spaced apart may be aligned mechanically in a column to a certain tolerance, for example elements might need to be mechanically aligned to a tolerance of order 10 μm and/or 1 mrad. For operation, finer electron-optical tolerances are required, such for alignment relative to the beams source, such as of 10 to 20 nm. Achieving tighter tolerances for a final alignment be done electron-optically with an electron-optical corrector such as a deflector for example as described previously in this description.

The correction for alignment may be over the whole multi-electron beam arrangement, with respect to groups of sub-beams comprising the multi-electron beam arrangement such as a strip corrector or for alignment that may be specific for each sub-beam, e.g. may vary from sub-beam to sub-beam, for example using an individual beam corrector. In particular, the strip corrector may be configured in accordance with the description in International patent applications WO 2021204733 A1 as filed 4 Apr. 2021 and WO 2021204734 A1 as filed 4 Apr. 2021, which documents are hereby incorporated by reference in particular to the disclosure of correctors. The individual beam corrector may be configured in accordance with the description in US patent applications US20120305798A1 as filed 30 May 2012 and US20120273690A1 as filed 27 Apr. 2012, which documents are hereby incorporated by reference in particular to the disclosure of an array of multipole electrodes which are each controllable to control the path of a respective sub-beam. The process of correctly aligning the element, e.g. for final alignment, is referred to as column alignment. Column alignment considers the positions of the sub-beams within the multi-electron beam in the plane of the sample, i.e. their relative displacement in the sample plane for example expressed in Cartesian coordinates in X and Y.

Figure 13:
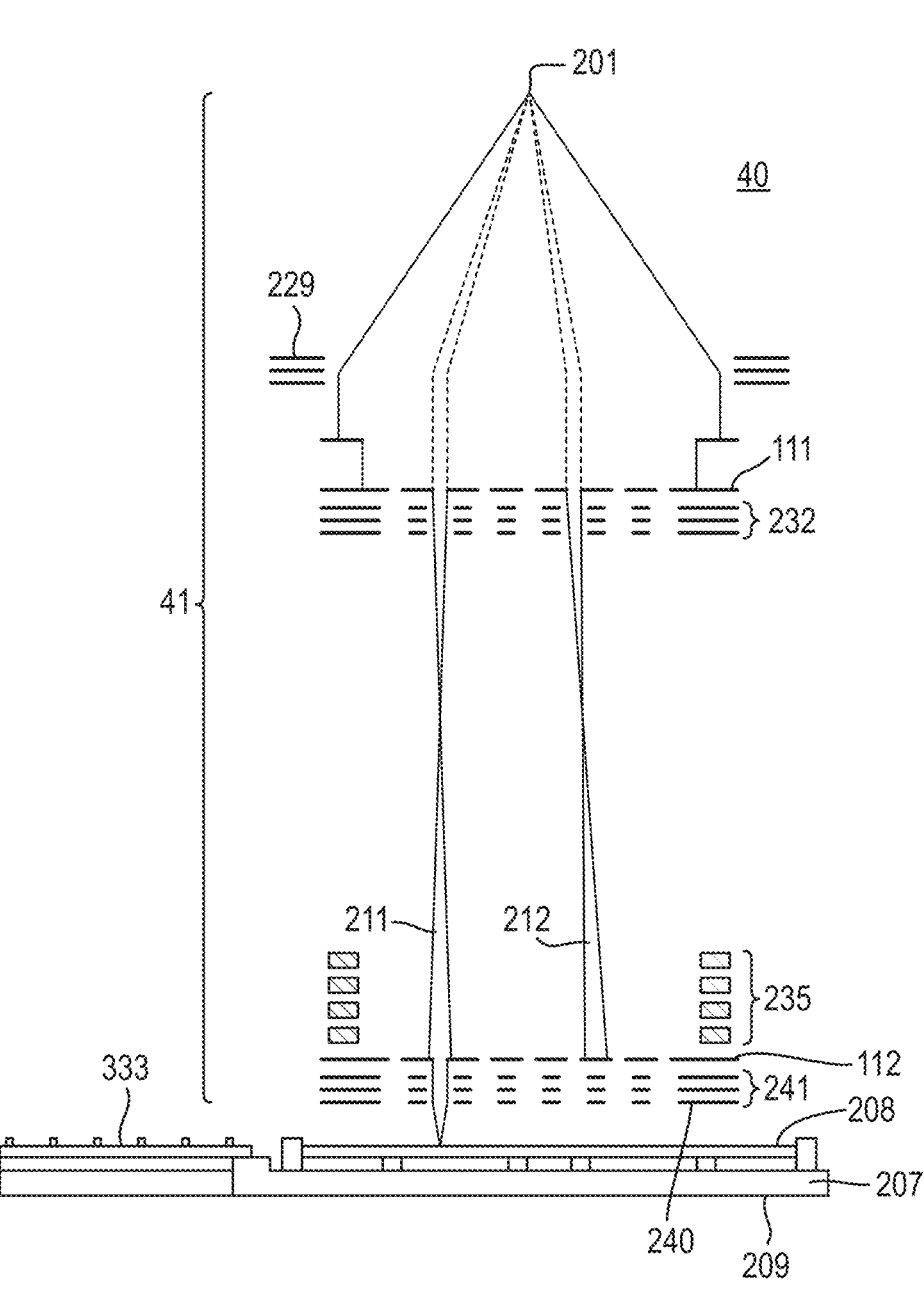
FIG. 13 is a schematic diagram of a charged particle apparatus in which the electron optical components are not aligned.

A known process of column alignment uses a detector as a target placed at a sample position e.g. on a sample stage. Desirably, the detector is able to detect all beams simultaneously to minimize the time taken for the column alignment procedure. A known detector requires a detector plate that is held on a movable stage that can be positioned at the target location (such as on a sample stage). The detector plate has a patterned surface with a pattern which may correspond to the arrangement of sub-beams in the multi-electron beam. The patterned surface is a plane of a sample surface. The alignment is in effect in a plane of the sub-beam and, expressed in Cartesian coordinates, is in an alignment in the X and Y axes. Downbeam of the patterned surface is a scintillator which scintillates where electron-beams impinge on it. A photonic detector such as a camera, e.g. a CCD device, may be positioned downbeam of the scintillator so as to detect a parameter of light generated by each beam such as its intensity. The alignment between detector plate and the camera is challenging for example in resolving the different light beams generated in the scintillator which may be only of the order of 50 to 100 micrometers apart. The detector unit 333 shown later in FIG. 13 is an example of such a sensor. In particular, the detector may be configured in accordance with the description in US patent application US20070057204A1 filed 14 Sep. 2006, which document is hereby incorporated by reference in particular to the disclosure of electron detection using a scintillator. Such a detector unit 333 is often placed in the focus plane of the beams or beamlets. Such a detector unit often comprises a blocking element which may take the form of a two dimensional pattern. Such a blocking element is at a focus plane of the beams or beamlets.

The relative alignment of elements of an electron-optical column (especially arrays of apertures such as the condenser lens array and the objective lens array, which can be MEMS elements) for column alignment may be achieved using a charged-particle detector, such as a detector array, which can detect a multitude of beams simultaneously, at a fixed position in the electron-optical column. The detector may be positioned towards the bottom of the electron optical column, desirably at the bottom of the electron-optical column. In particular, the detector may be configured in accordance with the description in International patent application WO 2021140035 A1 filed 23 Dec. 2020, which document is hereby incorporated by reference in particular to the disclosure of a detector array associated with objective lens array. Other arrangements are known in which the detector is positioned further up beam in the column for example associated with one or more electrodes of or associated with the objective lens array or even above the objective lens array. The detector is desirably close to the plane of a sample surface so that the detector can receive a sufficient number of secondary electrons for a detection signal from a sample for example during assessment. The position of the detector may be more proximate to the sample surface than the scintillator and photonic detector of for example the sensor in the stage.

The detector may be the same as detector used to detect signal particles during inspection. The charged particle detector is desirably a detector module that is used in the charged particle apparatus to detect signal particles that are generated when the primary electrons are incident on a sample. Thus the charged particle detector may have two functions. The charged particle detector has a function to detect a property of a sample when the assessment tool is operated in an assessment mode (as depicted in the charged particle device 41 shown in FIG. 9). Another a function of the charged particle detector is to detect charged particles for assessing alignment when the assessment tool is operated in a calibration mode. The calibration mode is with respective to the beam and may comprise two parts: a monitoring or measurement part when measurements are made to obtain information about and from the sub-beams and adjustment part. In the adjustment part one or more components may be adjusted or at least the settings of the one or more components in response to the information obtained from the sub-beams. Note in a calibration mode the charged particles that the detector detects are signal particles generated by primary sub-beams directed towards a calibrated surface (as depicted in the charged particle device 41 shown in FIG. 9); that is a surface having a known response to the plurality of sub-beams (which may be referred to as a multi-beam arrangement). In a different arrangement, the sample or another surface of the substrate support or at least the stage may be set to a potential the causes the primary sub-beams of the multi-beam arrangement to be redirected, e.g. mirrored, back in an up-beam direction (as depicted in the charged particle device 41 shown in FIG. 10) and as described later herein. Details of these calibration modes are described in PCT/EP2021/081134 filed on 9 Nov. 2021 which disclosure at least with respect to the calibration modes is hereby incorporated by reference.

Various approaches can be used to provide a flow of charged particles to the charged particle detector that is dependent on column alignment. Desirably, the current of received electrons in the calibration mode (such as in the returning primary sub-beams as depicted in and described with reference to FIG. 10) to each detector element is proportional (or at least monotonically related) to the current of the respective sub-beam at the sample position. In the case of misalignment, the sub-beam current will be reduced, e.g. because parts of the sub-beam intersect elements of the electron-optical column and are scattered or absorbed. Optimum alignment of a beamlet is therefore achieved when the current signal from the associated detector is a maximum. On detection of misalignment, the detector signal is used to control a relevant charged particle component such as a corrector as described above to increase the detector signal of the corresponding sub-beam and desirably to maximize the detector signal.

The embodiments consistent with the present disclosure can be applied to tools featuring a multi-electron beam configuration such as assessment and lithographic apparatus of various different architectures, including those depicted herein but also others. The exemplary assessment apparatus 40 shown in FIGS. 9 and 10 has a charged particle source 201 which emits charged particles toward aperture plate 111 (or beam limiting aperture array) which generates from (e.g. by splitting, separating or dividing) the charged particles a plurality of sub-beams, much like that depicted and described with reference to FIG. 3; however the same principles may apply in applying this arrangement to the charged particle device 41 shown in and described with reference to FIG. 8. The aperture plate therefore functions as a sub-beam generator. Condenser lenses 231 direct respective sub-beams to intermediate foci. A deflector 235 (which may be a macroscopic deflector or a deflector array) adjusts the direction of propagation of the sub-beams. An objective lens array 234 focuses respective sub-beams toward the sample 208. Electron detection device 240, or detector module, detects returning electrons, e.g. secondary electrons emitted by the sample.

Figure 10:
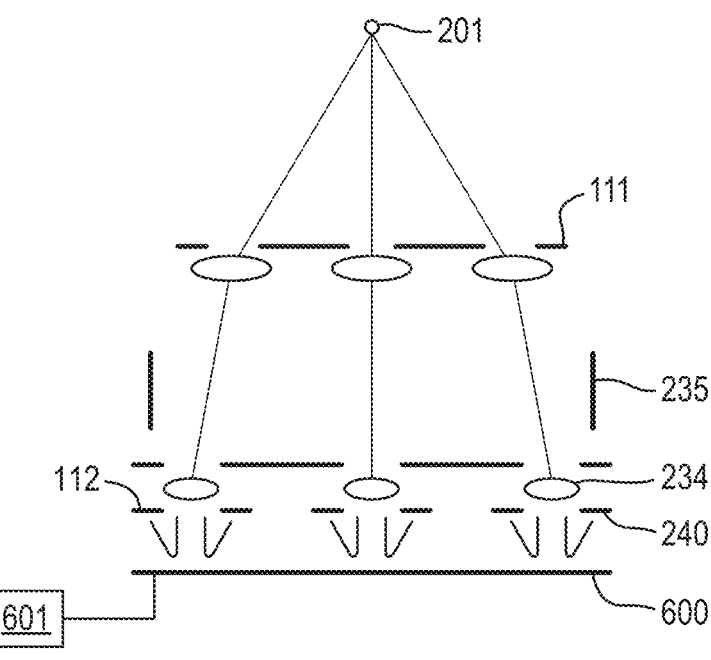

In some embodiments of the present disclosure, a charged particle mirror, e.g. an electron mirror for electron beams, is used to reflect the primary charged particle beams back towards the charged particle detector, as shown in FIG. 10. A charged particle mirror can be created by positioning an object 600 downbeam of the charged particle detector and the last electron-optic element of the electron-optic column. The object 600 may be a sample, the sample holder or another object held by the sample holder. The object 600 is set at a predetermined negative potential difference with respect to the cathode of the charged particle source 201 using potential source 601. If the charged particle beam comprises positively charged particles instead of electrons, a positive potential would be used. The predetermined potential difference may be of the order of $-1$ to $-100$ V, e.g. $-50$ V. Desirably the predetermined potential difference is greater in magnitude than the intra- and inter-beam energy spread. The potential difference between object and cathode will cause each beam to reverse direction towards the charged particle detector. The greater the magnitude of the potential difference, the shorter the distance required to reverse the trajectories of the charged particles. The objective lens array can be set to a particular voltage to optimize the detection yield.

Figures 11A, 11B:
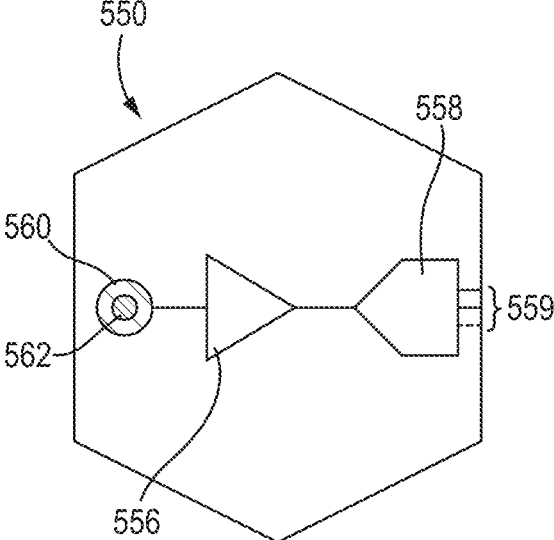
FIGS. 11A and 11B are schematic representations of a detector array and an associated cell array according to some embodiments, a schematic representation of a cell of the cell array, and a cell of the cell array according to some embodiments.

As shown in FIG. 11A a surface of a detector array or detector module (preferably facing, even proximate in use to, a sample) features an array of detector elements (or an array of detectors). Each detector element is associated with an aperture. Each detector element is associated with an assigned surface area of the substrate of the detector module. As the substrate is layered, for example in having a CMOS structure, each layer within the substrate is positioned with respect to the respective detector elements, desirably proximately. Commercially available CMOS structures have a usual range of layers, for example three to ten, usually about five. (For example, two functional layers may be provided for ease of description, which may be referred to as circuitry layers. These two layers of wiring layer and logic layer may represent as many layers as required and each layer is not restricted to wiring or logic, respectively.) The number of layers is limited by commercial availability and any number of layers is feasible.

Ideally a circuit layer of the substrate, which can be the wiring layer and/or logic layer, has a portion assigned for each detector element (or detector). The assigned portions of the different layers may be referred to as a cell 550. The arrangement of portions in the substrate for the full multi-beam arrangement may be referred to as a cell array 552. The cells 550 may be same shape as the surface area assigned for each detector element, such as hexagonal, or any reasonable shape that may tesselate and may all be similar in shape and/or area, such as a rectangular shape. Having a rectangular or rectilinear shape can more readily be used by placing and routing design. Such design is commonly implemented by software that is suited to define chips with a rectangular type of architecture with orthogonal directions, than architecture requiring acute or obtuse angles such as in a hexagonal architecture. In FIG. 11A the cells 550 are depicted as being hexagonal and the cell array 552 is depicted as a hexagon comprising individual cells. However, ideally each similarly located with respect to detector elements. Wiring routes 554 may connect to each cell 550. The wiring routes 554 may be routed between other cells of the cell array 552.

The circuit layer of a cell 550 is connected to a detector element of the respective cell. The circuit layer comprises circuitry having amplification and/or digitation functions, e.g. it may comprise an amplification circuit. A cell 550 may comprise a trans impedance amplifier (TIA) 556 and an analogue to digital converter (ADC) 558 as depicted in FIG. 11B. This figure schematically depicts a cell 550 with an associated detector element such as capture electrode and a feedback resistor 562 connected to the trans impedance amplifier 556 and the analogue to digital converter 558. The digital signal lines 559 from the analogue to digital converter 558 leave the cell 550. Note that the detector element is represented as a detector element 560 and feedback resistor is shown associated with the detector area as a disc 562 rather than associated with the trans impedance amplifier 556. This schematic representation is to represent each of the detector element and the feedback resistor as an area to indicate their relative size.

The circuit wire 570 connects the trans impedance amplifier in a cell 550 with the associated analogue to digital converter 558. The circuit wire 570 transmits an analogue signal. Unlike a digital signal, a data path transmitting an analogue signal is susceptible to interference. Signal interference can be from cross-talk with other circuit wires and from external fields such as generated by the sub-beams of the multi-beam and fields from nearby charged particle optical components such as the objective lens array 241.

The circuit wire 570 is routed through a wiring route 554 as depicted in FIG. 11A. The wiring route 554 is routed between cells so that the area of a cell and its layers is used for the amplification circuitry present on a cell. The wiring route 554 therefore only uses a portion of the circuit layers in which the wiring route is present, namely between adjoining cells 550 (e.g., at least around the beam apertures 504, 406 of the adjoining cells 550; through the adjoining cells 550 such as towards the periphery of the cells or between the circuitry in a layer assigned to the adjoining cells 550, or any arrangement between the stated arrangements). This routing avoids architectural interference of the amplification circuitry and the architecture of the wiring routes 554. Circuit wires are routed along the wiring routes in the cell array in an outward direction, for example in a radially outward direction. With greater proximity to a perimeter of the cell array 552, there may be more circuit wires 570 than in a portion of the wiring route 554 remote from the perimeter. The wiring route may have a plurality of circuit wires 570, which as described, is between cells of the array. Therefore a portion of the wiring route 554 may have more than one circuit wire 570. However, having circuit wires located close to each other risks crosstalk between the circuit wires and interference of the analogue signals transmitted by the circuit wires 570.

Figure 12:
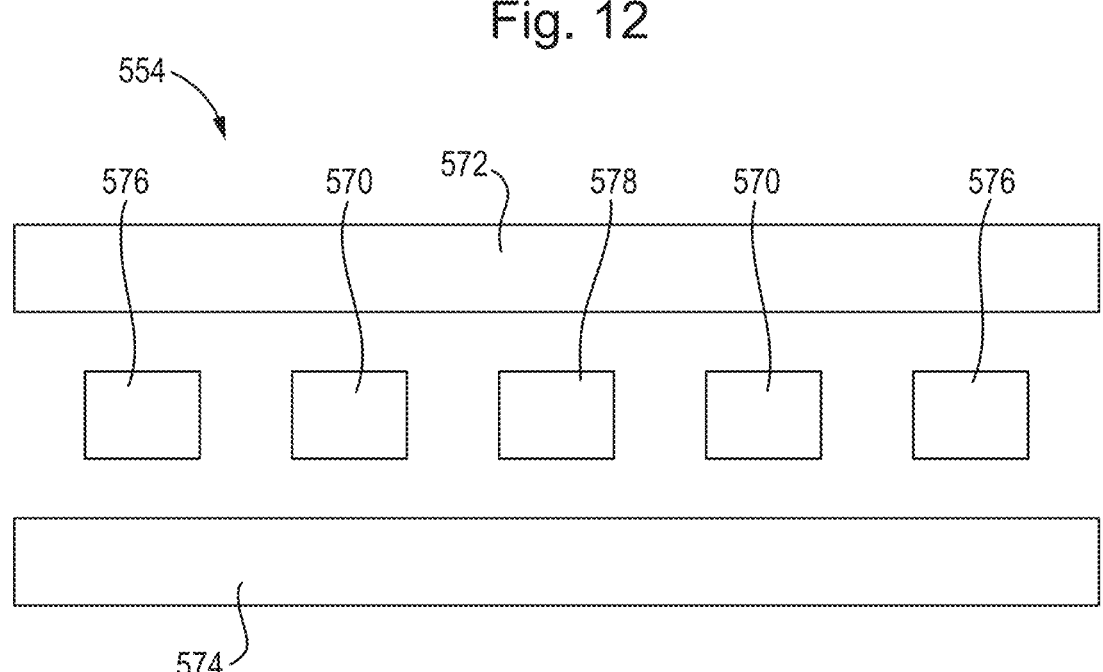
FIG. 12 is a schematic representation of a cross-section wiring route showing circuit wires and a shielding arrangement according to some embodiments.

The risk of crosstalk and signal interference may be at least reduced or even prevented by having the circuit wires 570 shielded from each other within the wiring route. FIG. 12 depicts cross-section of an exemplary arrangement of wiring route 554. Within the wiring route 554 are one or more circuit wires 470, shown extending in same direction as the wiring route 554 and a shielding arrangement. The circuit wires are shown in the same layer. Above the circuit wires 570 is an upper shielding layer 572; beneath the circuit wires 570 is a lower shielding layer 574 (or more down-beam shielding layer 574). The upper and lower shielding layers of the shielding arrangement shield the circuit wires 570 from fields external to the wiring route 554 above and beneath the wiring route 554. The shielding arrangement has shielding elements in the same layer as the circuit wires 570. The shielding elements may be outer elements 576 at the outer edges of the layer comprising the circuit wires 570. The outer elements 576 shield the circuit wires 570 from fields external to the wiring route 554. The shielding elements may include intermediate shielding elements 578 that are present in the layer between adjoining circuit wires. The intermediate shielding elements 578 may therefore at least suppress if not prevent cross-talk between the circuit wires 570. In operation, a common potential is applied to the shielding layers 572, 574 and shielding elements 576, 578. The potential may be a reference potential for example a ground potential.

As discussed above, charged particle optical components (such as, for example, electron optical components) in charged particle apparatus are used to create and manipulate a plurality of beamlets. The electron optical components can include electron optical apertures, lenses, deflectors and other manipulations of the beamlets. These electron optical elements need to be aligned accurately such that all of the beamlets can be directed to a target (e.g., a sample). These electron optical components are typically aligned mechanically in the charged particle apparatus in combination with electron optical alignment by changing settings of the electron optical components, for example, deflectors and/or lenses.

The existing technology requires all of the beamlets to pass through the apertures in the aperture array to impact the target such that any signal particles that are emitted by the sample in response to each beamlet is simultaneously detected by a detector array as a corresponding detection signal. However, if the charged particle device does not achieve the desired alignment, then the beamlets will not impact the target simultaneously. That is, alignment within the charge particle device for example between different charged particle components and between one or more charged particle components and the paths of the sub beams of the multi-beam arrangement should meet a predetermined specification for adequate operation of the charged particle device. Adequate operation may require the relative alignment between specified charged particle components and with one or more charged particle components and the paths of the sub-beams to be with a within a predetermined range.

FIG. 13 illustrates a charged particle apparatus in which the charged particle optical components are not aligned (or unaligned). The charged particle apparatus illustrated in FIG. 13 comprises a source 201, and an aperture plate 111 and is configured to convert the primary beam into a plurality of beamlets 211, 212 which may be referred collectively as a multi-beam arrangement. As shown in FIG. 13, the source beam is collimated by macro collimator 229 before being split into the plurality of beamlets of the multi-beamlet arrangement. Although shown as an electro-static collimating lens, the macro collimator 229 may be magnetic and may have the features of a magnetic collimator which may be used in the arrangement shown in and described with reference to FIG. 8 in place of the collimating array 271. As depicted, a beamlet 211 that passes through aperture array 112 to contact the sample 208 whilst another beamlet 212 is directed, for example by a deflector and/or disturbance in the charged particle component 232, towards a plate which forms the aperture array 112. The other beamlet 212 does not pass through the plate by passing through an aperture in the plate. The beamlet 212 is inhibited from reaching the target (e.g. sample 209) by operation of the deflector to cause impact of the beamlet 212 on the plate of the aperture array 112. A deflection caused by a disturbance in the charged particle component 232 results in an undesired misalignment of the beams 211, 212 on the aperture array 112. (Note: charged particle component 232 may comprise series of plates taking the form of a lens array such as a condenser lens array to cause the beamlets to have an intermediate focus between the two aperture arrays 111, 112. Additionally or in the alternative, the charged particle component 232 may comprise a deflector array. The deflector array may comprise individually controllable detectors each of which may be assigned to a beamlet 211, 212. The presence of such a deflector array can be used to optimize alignment of the beamlets 211, 212 on the aperture array 112).

As a consequence of some beamlets failing to reach the target, the detected signal of the detector may be weak. Such a weak signal may be indicative of misalignment. However a weak signal may have insufficient information to determine whether or not one or more corrections (or changes) are to be made to the settings in order to achieve the desired alignment. It is often beneficial to apply different combinations of settings (or setting values) of the various electron optical components until the desired alignment is obtained. For example, in the apparatus of FIG. 13, in order to achieve the desired alignment, the settings (or settings values) of deflectors 235, 232 might be altered. (Note in a collimating function the deflectors of charged particle component 232 may apply fine correction with respect to the collimation achieved by macro-collimator 229 which may be controllable to optimize alignment). Often the settings of the various electron optical components for the desired alignment is determined by experimentation and trial and error. Determining settings of the different electron optical components using trial and error can be a time consuming process. As each component may have its own setting and the settings of one or more components may be dependent on at least the setting of another electron optical component. For an electron optical device 41 with a number of electron optical components, there are many different combinations of settings values that may exist. Working through the combinations of different settings for the number of different electron optical components can be time consuming, potentially reducing availability of the electron optical apparatus.

The present disclosure concerns a method which seeks to reduce the time taken to determine the alignment of the electron optical components of the charged particle apparatus. The method may enable a parameter set (or multiple parameter sets), including for example a value corresponding to at least one of the relative positions, shapes and sizes of the beamlets, to be determined. These parameter sets can be used to inform the updating of one or more values of settings of the charged particle apparatus, such as settings of the electron optical components for example within the charged particle device 41. In this way the desired alignment may be achieved in a reduced amount of time due to requiring less trial and error. In an arrangement, one or more settings of the charged particle optical device 41 is optimized automatically.

The method is applicable to charged particle apparatus such as depicted in FIGS. 8 to 10, 13 and 14. The charged particle apparatus 500 illustrated, for example in FIG. 14, comprises an aperture array 112 and a detector 240, 333. The aperture array 112, which may be a plate, defines a plurality of apertures through which the paths of beamlets 215 pass. The aperture array may be comprised in the charged particle device 41. (The beamlets 215 comprise the same beamlets 211, 212 which are referred to as part of the multi-beam arrangement with the reference 215 for ease of reference). The detector 240, 333 is configured to detect charged particles corresponding to the plurality of beamlets 215 that pass through the corresponding apertures in the aperture array 112. The detector is positioned downbeam along the paths of the beamlets 215 relative to the aperture array 112. (The possible form that the detector is described later herein). The detector 240 may be comprised by the charged particle device 41. Additionally or alternatively the detector 333 is comprised in a stage and/or coplanar with a sample 208. The charged particle apparatus 500, such as the charged particle device 41, further comprises electron optical components operable on the plurality of beamlets 215. The electron optical components comprise components disposed upbeam of the aperture array 112, such as the deflectors 235. The electron optical components may include the aperture array 112.

This method is not suitable to determine the alignment of electron optical components disposed downbeam of the aperture array 112, over which the beamlets are scanned. This is because alignment is performed relative to the aperture array 112 based on the information collected by scanning the beamlets over the aperture array 112. At the aperture array 112, charged particle optical components up beam of the aperture array 112 have operated on the beamlets of the multi-beam arrangement. The characteristics of the beamlets relate to the information about the up beam charged particle optical elements. However the beamlets have yet to interact with charged particle optical components down beam of the aperture array 112. The characteristics of the beamlets therefore do not relate to information about such down beam charged particle optical components.

Each beamlet 215 is scanned over a respective portion of the aperture array 112 in a plane of the aperture array 112. An aperture is defined in each of the respective portions of the aperture array. Consequently, charged particles of each beamlet 215 may pass through the corresponding aperture during the scan. Two or more apertures are optionally defined in each of the respective portions of the aperture array.

Figure 14:
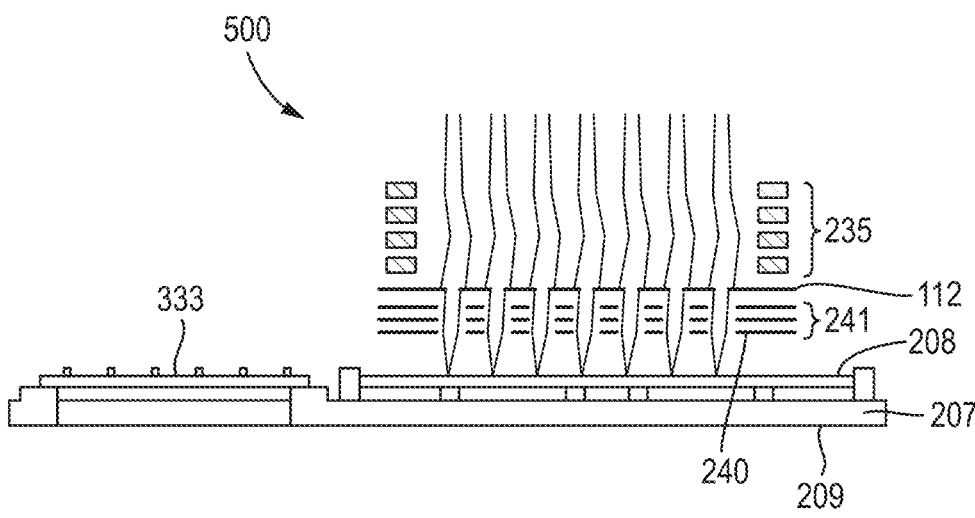
FIG. 14 is a schematic diagram of a charged particle apparatus wherein a plurality of beamlets are being scanned over an aperture array.

The charged particle apparatus 500 illustrated, for example in FIG. 14 comprises deflectors 235 disposed upbeam of the aperture array. The deflectors 235 may be used to manipulate the beamlets to scan over the respective portions of the aperture array 112.

Figure 15:
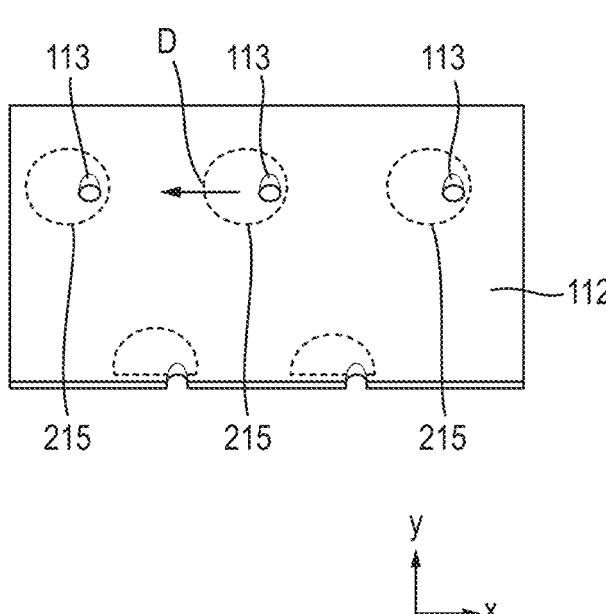
FIG. 15 is a schematic diagram of beamlets being scanned over a plane X-Y of the aperture array.

FIG. 15 illustrates a view of the plane X-Y of the aperture array 112 in which a plurality of apertures 113 are defined. The beamlets 215 are scanned in a direction D along the plane X-Y of the aperture array. The beamlets 215 are scanned across respective portions of the aperture array 112 such that the beamlets 215 are scanned across the apertures 113. The beamlets 215 therefore may, at certain times during the scan, pass through the apertures 113 as shown. At other times during the scan, some or all of the beamlets may be partially or completely inhibited (or blocked) by the aperture array 112. Such inhibited beamlets either partially or completely fail to pass through the aperture array 112 to pass downbeam of the aperture array 112, for example to a region downbeam of the aperture array 112.

While the beamlets 215 are scanned across the portions of the aperture array 112, any charged particles corresponding to each beamlet that passes through the corresponding aperture are detected by the detector. A detection pixel value is generated for each beamlet based on the detection (or not) of charged particles corresponding to each beamlet at intervals of the scan. The detection pixel value may be binary (i.e. indicating detection of less or more particles than a threshold) or multi-valued.

The scanning and detecting is desirably performed simultaneously for a plurality of beamlets. The scanning and detecting is more desirably performed simultaneously for all of the beamlets projected through the aperture array, as shown in FIG. 15. Alternatively, each beamlet or a group of the beamlets of the multi-beam arrangement could be scanned and detected individually, at separate times. However implementations of the invention would take longer than a simultaneous scan and detection of all of the beamlets.

The detection optionally comprises detecting any charged particles corresponding to each beamlet that pass through the corresponding aperture at the intervals during the scan. In other words, the detection is performed at discrete time points during the scan such that data of charged particles corresponding to each beamlet is only captured at intervals during the scan. Alternatively, the detection may be performed continuously during the scan, and the detection pixels corresponding to each interval may be generated by subsequently discretizing the data based on the detection of charged particles corresponding to each beamlet.

Each detection pixel comprises information related to the corresponding beamlet and a time interval during the scan, e.g. a detection pixel value. In particular, each detection pixel comprises information of the intensity of charged particles corresponding to each beamlet that pass through the corresponding aperture at the intervals during the scan. This information is collected by storing or processing the information comprised in the detection pixels. The information may be stored or processed remotely or locally to the charged particle apparatus. Alignment of one or more of the electron optical components, relative to the aperture array, may be determined based on the collected information.

The information of the intensity of charged particles correlates to information of the current of the charged particles. Thus, this information can enable comparisons between the relative intensity, or relative current, of different beamlets. It also enables comparisons of the relative intensity, or relative current, of a single beamlet at different intervals during the scan. In this way, it can be determined whether or not the optical components of the charged particle apparatus are aligned such that all beamlets pass through the aperture in the aperture array in the desired manner, for example simultaneously.

Figure 16:
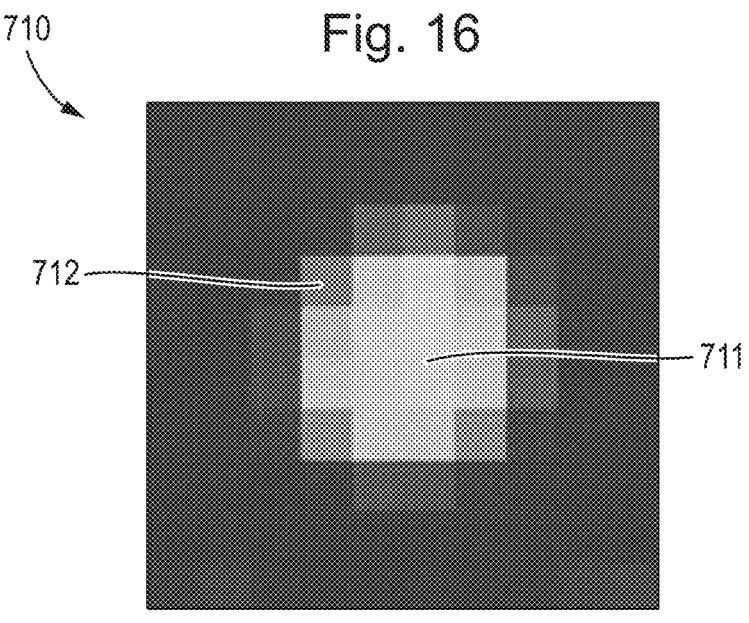
FIG. 16 is an exemplary image based on a plurality of detection pixels representing the intensity of charged particles corresponding to a beamlet.

The detection pixels are desirably processed by generating an image for each beamlet, such as the image 710 of FIG. 16. The image is representative of the intensity of detected signal particles corresponding to the scan of the beamlet over the portion of the aperture array in which its corresponding aperture is defined. In image 710, the level of brightness in the image is representative of the intensity of charged particles detected, with brighter pixels being indicative of greater intensity. Alternatively, different levels of intensity could be represented in different ways in the combined image, for example by using different colors for high and low intensity.

The image desirably comprises the collected information of each interval for the beamlet, as shown in FIG. 16. In particular, each detection pixel forms a pixel of the image 710. So each pixel (or element) of the image may correspond to a detection pixel generated at different time during the scan. For example, pixels 711 and 712 provide information of the intensity of charged particles corresponding to this beamlet at different intervals during the scan of the beamlet over the respective portion of the aperture array. The relative intensity corresponding to each detection pixel is depicted in FIG. 16 by different brightness of each pixel. In FIG. 16 a pixel 711 is brighter than another pixel 712 meaning that at the interval corresponding to the pixel 711 a higher intensity of charged particles was detected corresponding to this beamlet than was detected at the interval of the scan corresponding to the other pixel 712.

Figure 17:
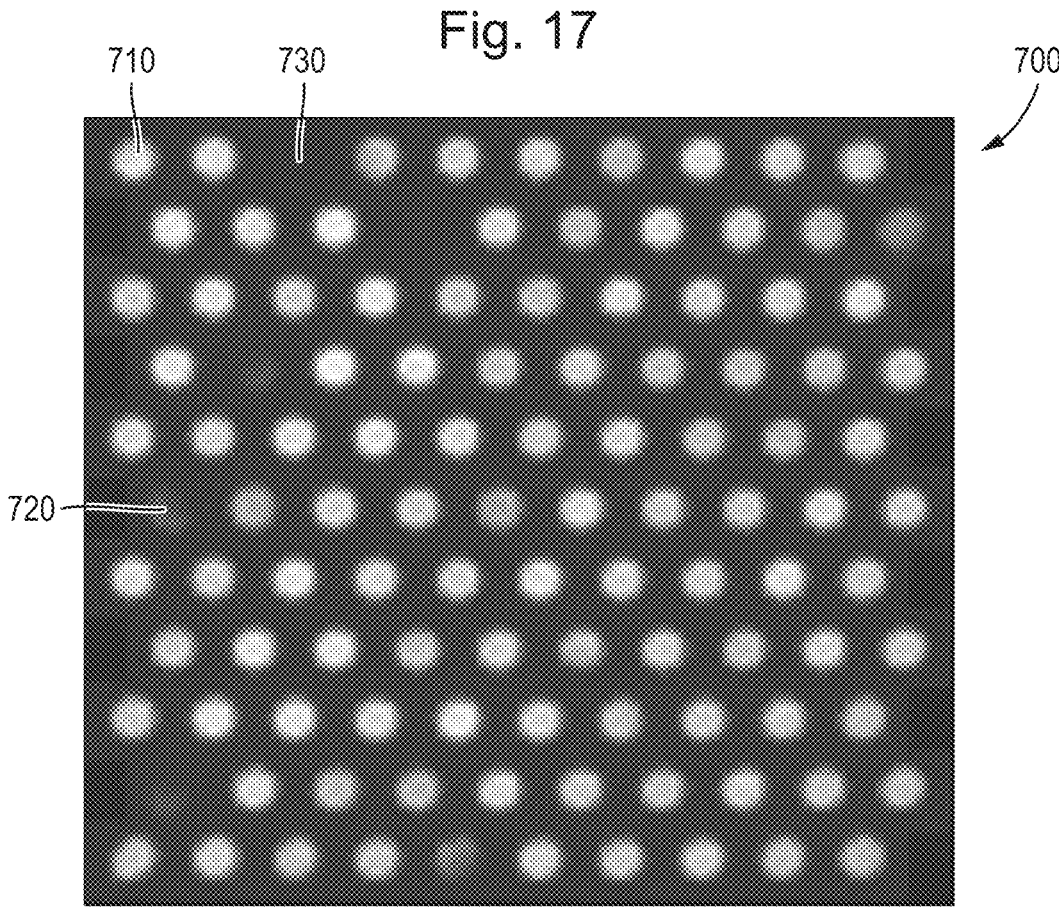
FIG. 17 is an exemplary combined image, based on a plurality of images, representing the intensity of charged particles corresponding to a plurality of beamlet.

A combined image 700, such as shown in FIG. 17, may be generated. Combined image 700 is representative of the scan of the plurality of beamlets over the aperture array and is based on a plurality of the images. In combined image 700, the level of brightness in the image is representative of the intensity of charged particles detected, with brighter pixels being indicative of greater intensity. Alternatively, different levels of intensity could be represented in different ways in the combined image, for example by using different colors for high and low intensity. The pixels of greater brightness represent information about the beamlet which may be extractable from the image. The pixels of the greater brightness tend to congregate together. The pixels of greater brightness form a spot within the image. The spot may be considered to representative of the corresponding beamlet.

Combined image 700 comprises the information of all of the plurality of the beamlets. Combined image 700 comprises information of each detection pixel associated with each of the plurality of beamlets. The combined image comprises the collected information of each interval for the plurality of beamlets. If desired, for example to save storage space and/or processing time, a combined image may instead be generated based on images of only a subset of the plurality of beamlets. Additionally or alternatively, the combined image may not include information of every detection pixel associated with the beamlets included in the combined image, such that information for some intervals is not included in the combined image. That is the combined image may comprise a selection of the images of the beamlets of the multi-beam arrangement.

Combined image 700 is based on a plurality of images 710 for example images 720, 730. The combined image 700 may correspond to images generated by scanning the beamlets 215 over respective apertures of the aperture array 112. The positions of the images 710, 720, 730 represented in the combined image 700 are determined based on the physical positions of the apertures in the aperture array. The apertures correspond to the beamlets associated with each of the images 710, 720, 730. For example, the distances between the images 710, 720, 730 represented in the combined image are determined in part based on the distances between the corresponding apertures in the aperture array 112.

The combined image can be used to compare various parameters of the different beamlets for example the relative positions, sizes shape and intensity corresponding to the different beamlets. The parameters of the different beamlets may be present as features and characteristics of the corresponding spots within the combined image. Combining the images 710, 720, 730 uses the measured relative position of the apertures assemble the images. However, in each image the pixels of greater brightness, for example the spot may have different positions. Therefore the distances between similar features of the spots in the combined image may provide information of the corresponding beamlets with respect to each other such as the alignment of the beamlets on that aperture array 112. For example as shown in FIG. 17, image 710 is brighter than image 720. This may indicate that there is some misalignment associated with beamlet corresponding to the spot of image 720 with respect to the other beamlets of the multi-beam arrangement at least at the aperture array 112. The spot of image 730 is completely dark, indicating low intensity. This may indicate a blockage for example in the aperture of the aperture array corresponding to this beamlet or another problem associated with the beamlet for example in the aperture array or a charged particle optical element that operates on the beamlet up beam of the aperture array. Such a problem may be undesired charging on a surface that interacts with the beamlet or other undesired deflection of the beamlet. The root cause can be determined by variation of a setting associated with an up beam charged particle optical component that operates on the beamlet as will be described further later herein.

The information comprised in the detection pixels may be used to determine a parameter set of at least one beamlet. The parameter set comprises at least one parameter value.

The parameter set may relate to dimensions of the beamlet in a plane of the aperture array. In particular, the parameter set may comprise a dimension of one or more beamlets. For example, the parameter set may comprise a value representative of the shape of the beamlet, such as a value which indicates whether the beamlet is round or elliptical in the plane of the aperture array. Alternatively or additionally, the parameter set may comprise a value representative of the width and/or a value representative of the length of the beamlet in the plane of the aperture array.

The parameter set may additionally or alternatively comprise a characteristic of information of the detection pixels, desirably the pixels that define the spots corresponding to the beamlets. For example, the parameter set may comprise a value representing a variation in the characteristic of the detection pixels, such as the variation in intensity of the detection pixels, desirably over the image, at least over one or more respective spots in the image. For example the parameter set can include values representative of intensity of the detection pixels in the image as a function of position in the image. Alternatively or additionally the spot is fitted to the detection pixels having elevated brightness in the image, for example pixels that exceed an intensity threshold or pixels that have similar intensity within a range and which is greater than other pixels of the image. The intensity threshold may be set relatively low; an intensity range may be set to be narrow. The pixels corresponding to the spot may have uniform intensity and so may have a profile of a top hat function. In such a top hat function the pixels representative of the spot may have a substantially uniform intensity; the pixels of the image outside the spot may have a very low intensity. The positions of the different beams and their relative positions may be determined by considering the center of each spot. In these different ways it can be determined whether the beamlet is passing through the corresponding aperture as expected at different times in the scan, corresponding to different positions of the beamlet over the portion of the aperture array. Consequently, any misalignment can be identified by analysis for the parameter set.

The parameter set may relate to a plurality of beamlets. Desirably, the parameter set relates to all of the beamlets in the charged particle apparatus. Determining the parameter set may comprise determining a plurality of individual beam parameter sets each relating to a single beamlet and generating the parameter set from the plurality of individual beam parameter sets. Alternatively, the parameter set may be determined from a combined image comprising detection pixels relating to multiple beamlets.

The parameter set relating to a plurality of beamlets may comprises an alignment parameter set of the plurality of beamlets in the plane of the aperture array. The alignment parameter set may comprise the relative intensity, position and/or shape of the beamlets represented in the parameter set. For example, the alignment parameter set may comprise a beam pitch between two or more of the beamlets in the plane of the aperture array. Desirably, the beam pitch comprised in the alignment parameter set is representative of all beamlets in the plane of the aperture array.

The parameter set can then be analyzed to determine whether there is any misalignment based on parameters of individual beamlets and/or the parameters of a plurality of beamlets. Parameters of the parameter set relating to misalignment (for example in a cartesian coordinate system) may comprise at least one of: position relative to orthogonal directions in the plane of the aperture array 12, displacement of a beamlet away from its ideal position in each of the two directions, offset, pitch error, etc.)

The charged particle apparatus has a set of settings corresponding to the configuration of the electron optical components disposed upbeam of the aperture array over which the beamlets are scanned. In an arrangement comprising an additional aperture array upbeam of the aperture array, the settings correspond to the configuration of the electron optical components disposed upbeam of the aperture array and downbeam of the additional aperture array.

A setting of the set of settings may be changed in order to alter the manipulation of one or more beamlets by the corresponding electron optical component. At least one setting of the set of settings may be changed based on the parameter set. The at least one setting may be changed automatically based on the parameter set. Alternatively, a user may input the change to the at least one setting based on their review of the parameter set.

The set of settings may comprise, for example, a setting of an aberration corrector or a setting of a collimator. The collimator may comprise a lens or a deflector, which is optionally arranged in an array. The set of settings may comprise, for example, a setting associated with manipulation of individual beamlets of the plurality of beamlets. In other words, the setting may be associated with an individual beam corrector, which may be comprised in an array of individual beam correctors. Additionally or alternatively, the set of settings may comprise a setting associated with manipulation a plurality of beamlets. For example, the setting may correspond to a setting of a meso lens or a meso deflector. Additionally or alternatively, the setting may be associated with an array and the set of settings may comprise a setting associated with manipulation of all of the plurality of beamlets. For example, the setting may correspond to a setting of a macro lens or a macro deflector, which may operate magnetically or electrostatically. The deflector may be such as described in US patent application US20150069259A1 filed 4 Sep. 2014, which disclosure is hereby incorporated by reference at least so far as the disclosure of a deflector for groups of sub-beams of a multi-beam arrangement, or as described in International patent application WO 2021156121 A1 filed 27 Jan. 2021, which disclosure is hereby incorporated by reference at least so far as the disclosure of strip electrodes to function as deflector arrays. Suitable correctors include correctors associated with for example: within and even integrated into the objective lens array for example as shown and described with reference to FIGS. 3, 8, 13 and 14, and into the condenser lens array or example as shown and described with reference to FIG. 3; associated with a deflector array operating as a collimator array for example immediately upbeam or down beam of or integrated into the deflector array 232, 235 which may be situated at an intermediate focus 233 of the beamlets, such as shown and described with reference to FIGS. 3 and 13. Such a corrector is disclosed in International publication WO 2021204734 A1 filed 4 Apr. 2021 and WO 2021204733 A1 filed 4 Apr. 2021, which disclosures are hereby incorporated by reference at least so far as the disclosure of correctors. Such a corrector may be a macro corrector positioned upbeam of the beam limiting aperture array 111, 231, 252 and may be combined or integrated with any macro charged particle optical component between the source 201 and the beam limiting aperture array 111, 231, 252. Such a corrector is disclosure in EP Application 21215703.6 filed on 17 Dec. 2021 which disclosure is hereby incorporated by reference at least so far as the disclosure a macro corrector.

In an arrangement, such as that of FIG. 13 having an additional aperture array such as beam limiting aperture array 111, the position of the additional aperture array relative to the aperture array 112 may be changed, for example by actuation such as automatic actuation, based on at least one parameter of the parameter set. For example, from the parameter set, it may be determined that the aperture array 112 is not aligned with respect to the additional aperture array 111.

The scanning comprises scanning each beamlet along a scanning path. The scanning path defines a scanning pattern in the plane of the aperture array. Desirably, the scanning path has a main scanning direction and a sub-scanning direction. The main scanning direction is different from the sub-scanning direction. The directions of the main scanning and sub-scanning may be substantially mutually orthogonal.

Figure 18:
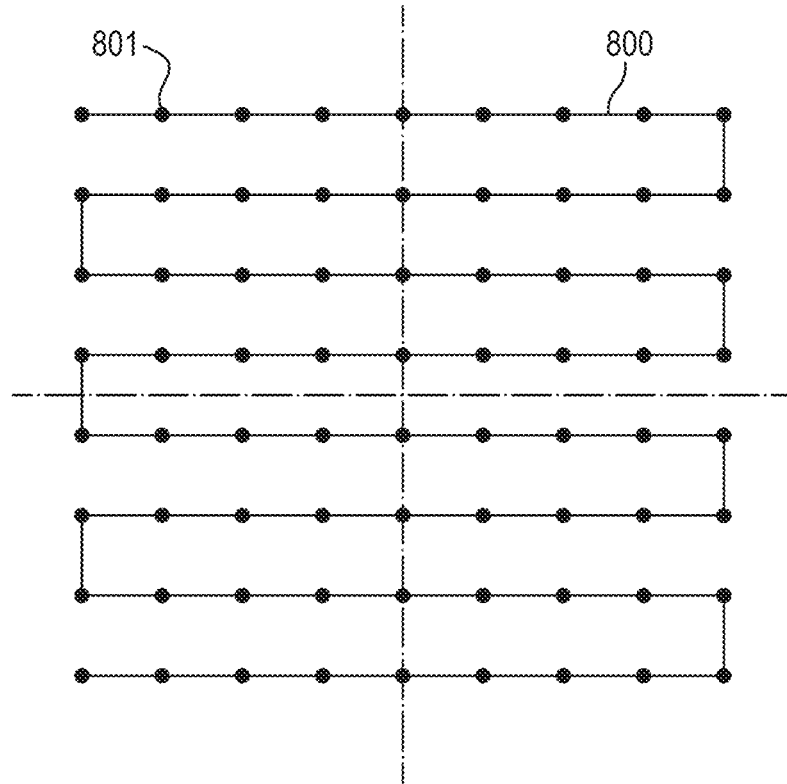
FIG. 18 is an exemplary beamlet scanning pattern.

In the example shown in FIG. 18, the scanning pattern 800 is raster scanning pattern. The main scanning direction is the direction X. The sub-scanning direction Y is perpendicular to the main scanning direction X. The directions X and Y of FIG. 18 optionally correspond to the X and Y directions of FIG. 15, which depicts the X-Y plane of the aperture array. In this way the respective portions of the aperture array are efficiently scanned. The main scanning direction may be considered to be along a row. The sub-scanning direction may be considered to be stepping between adjoining rows. The main scanning direction may alternate between adjacent rows, as depicted in FIG. 18. In a different arrangement, the main scanning direction may be the same for all rows.

For each beamlet, the scanning path is arranged to cover the respective portion of the aperture array, which includes an aperture. Each detection pixel corresponds to a position 801 of the beamlet on the scanning path. Each detection pixel therefore provides information of the detected intensity of charged particles corresponding to the particular beamlet at a position.

The plurality of beamlets having a beam pitch, which is a distance between corresponding positions on adjacent beamlets in the plane of the aperture array. The distance each beamlet is scanned over the corresponding portion of the aperture array in the main scanning direction is less than a number of beam pitches. In particular, the distance each beamlet is scanned over the corresponding portion of the aperture array in the main scanning direction is desirably less than or equal to the beam pitch. In this way the apertures may be efficiently scanned because each beamlet scans a respective portion of the aperture array which does not overlap with the portion scanned by another beamlet. In a variation in which each beamlet is assigned a respective portions of the aperture array comprising two or more apertures, the same scan path may be applied over the portion. Note the respective portions may be contiguous or overlap, so that more than one beamlet scans the same aperture of the aperture array 112.

In some arrangements, the beam pitch may be constant for the plurality of beamlets. In other words, the distance between corresponding positions, for example the corresponding feature of adjacent beamlets, such the centers of adjacent beamlets (which may be calculated based on the image of each beamlet) is the same for any two adjacent beamlets of the plurality of beamlets. In other arrangements, the beam pitch may vary for the plurality of beamlets. In other words, the distance between corresponding positions, for example the centers, of a first and a second beamlet, adjacent to the first beamlet, is greater than the distance between corresponding positions on the second beamlet and a third beamlet, adjacent to the second beamlet.

Figure 9:
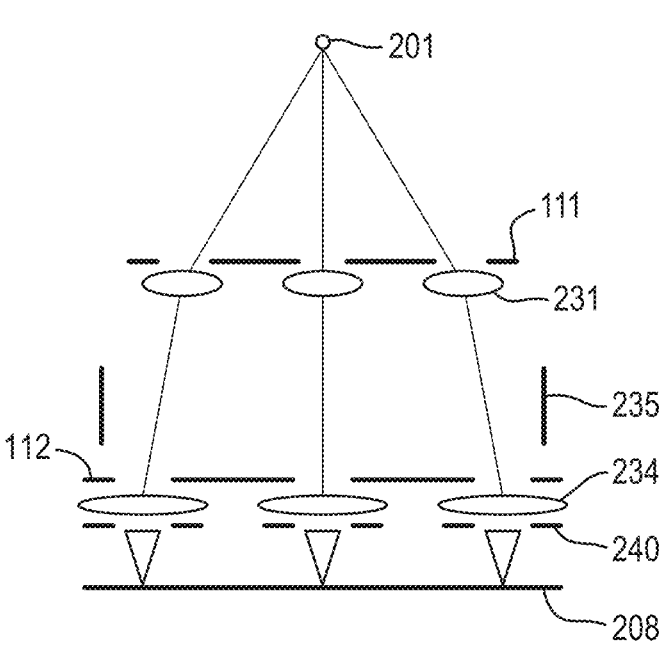
FIGS. 9 and 10 are schematic diagrams showing an exemplary multi-beam apparatus according to some embodiments operating in assessment and calibration modes.

The detector may comprise a charged particle detector array disposed downbeam of the aperture array. The detector may be an electron detection device 240, or detector module, configured to detect signal particles generated in response to the sub-beams of the multi-beam arrangement, or the reflected (or mirrored) sub-beams of the multi-beam arrangement. The charged particle apparatus may be configured in the calibration mode such at the detector detects signal particles emitted by the sample, as shown in FIG. 9. The charged particle apparatus may be configured such at the detector detects primary charged particles reflected from an electron mirror back to the detector, as shown in FIG. 10. Such a detector may comprise the charge detector elements, semiconductor based detector elements such as PIN detector elements and/or electron to photon converter elements such as scintillators. The electron to photon converters may be photonically coupled to a phone to electrical signal converter connected to electronic circuitry.

The detector may comprise a component disposed downbeam of the aperture array. For example, the detector may comprise a detector plate disposed downbeam of the aperture array. The detector plate may comprise a scintillator and the detector may further comprise a photonic detector may be disposed downbeam of the scintillator. The light generated by the scintillator is proportionate to the current and thus the intensity of the charged particles. Consequently the detection pixels can be readily obtained using this type of detector.

In a different arrangement the detector may be incorporated in or supported by the stage 209 of the apparatus of FIGS. 13 and 14 as detector unit 333. In the arrangement of either FIGS. 3 and 9, this type of detector may be provided in the stage in addition to or in place of the electron detection device 240. In an arrangement the detector plate is desirably disposed in the detector unit 333

In an arrangement, a detector such as monitoring detector (for example in the form of a detector array with a detector element for each sub-beam of the multi-beam arrangement) that is down beam of the aperture array 112 may be used to generate detection signals in a calibration mode for generation of the combined image. Such monitoring detector is a dedicated detector for monitoring the sub-beams of the multi-beam arrangement within the charged particle device for example associated with a charged particle optical component even integrated into the respective charged particle component. Such a monitoring detector may be separate from the detector 240 used to detect signal particles in the assessment mode. Details of suitable monitoring detectors are disclosed in EP Applications 21215700.2, filed on 17 Dec. 2021, and 21216063.4, filed on 20 Dec. 2021, both of which are incorporated by reference at least so far as the disclosure of monitoring detectors.

The electron optical components of the charged particle apparatus may comprise an additional aperture array disposed along and upbeam the paths of the beamlets relative to the aperture array. The plurality of beamlets are directed through the additional aperture array 111 towards the aperture array 112. The additional aperture array desirably comprises a beam-limiting aperture array for generating or shaping the plurality of beamlets. As illustrated in FIGS. 8 to 10, 13 and 14, the additional aperture array may be an aperture plate 111 configured to convert the primary electron beam into a plurality of beamlets 211, 212. Alternatively, the additional aperture array may be disposed downbeam of the electron optical component which converts the primary electron beam into a plurality of beamlets. Such an additional aperture array may be any electrode that operates upbeam of the aperture array 112. In such a situation a generating beam limiting aperture array should be up beam of the additional aperture array to generate the plurality of beamlets up beam of the additional aperture array. Such an additional aperture array may be a lensing electrode of the charged particle optical component 232 or condenser lens array 231. The additional aperture array may comprise a corrector array, a lens array or any other aperture array. Such a corrector array desirably may operate differently on different beamlets of the multi-beam arrangement. For example, the corrector could be an array of individually controllable multipoles. Such a corrector may be referred to as an individual beam corrector. In an arrangement the additional aperture array is a macro-electron optical element for example with a single aperture for either the source beam or all beamlets of the multi-beam arrangement. In such an arrangement situation a generating beam limiting aperture array for generating the plurality of beamlets should be either up beam or down beam of the macro-electron optical element.

Deflectors are desirably disposed upbeam of the aperture array 112 over which the beamlets are scanned. The deflectors are desirably disposed downbeam of the additional aperture array. The deflectors are desirably configured to manipulate each of the beamlets to scan over the aperture array to perform the scanning.

Alignment of the additional aperture array, relative to the aperture array, may be determined based on the collected information. Alignment may be achieved by controlling potential applied to one or more of the charged particle optical elements in the charged particle device such as a deflector 229, 232, 235, 271, 260 and a corrector. Additionally or alternatively alignment may be achieved by actuating one or more charged particle optical components to adjust its position within the charged particle optical device 41.

The charged particle apparatus 40 optionally comprises a further aperture array positioned downbeam in the paths of the beamlets from the aperture array. The further aperture array should not be a beam limiting aperture array. Desirably the paths of the beamlets are through the apertures in the further aperture array. The further aperture array does not intercept or occlude the path of the beamlet down beam of the aperture array 112 over which the beamlets of the multi-beam arrangement is scanned.

Further deflectors may be provided upbeam of the further aperture array and downbeam of the aperture array. The further deflectors may be configured to manipulate the beamlets to scan over the further aperture array. The alignment of electron optical components disposed upbeam of the further aperture array and downbeam of the aperture array may therefore be determined relative to the further aperture array. This may be achieved by scanning each of the beamlets over the further aperture array in the same manner as the beamlets are scanned over the aperture array of for example FIG. 14, as described above.

The method may be implemented using a computer program. In particular, the computer program comprises instructions configured to control the charged particle apparatus. The instructions are configured to control the charged particle apparatus to scan each beamlet in a plane of the aperture array over a portion of the aperture array in which a corresponding aperture of the aperture array is defined so that charged particles of each beamlet may pass through the corresponding aperture. The instructions are configured to control the charged particle apparatus to detect, during the scan, any charged particles corresponding to each beamlet that passes through the corresponding aperture. The instructions are configured to control the charged particle apparatus to generate the detection pixel for each beamlet based on the detection of charged particles corresponding to each beamlet at intervals of the scan, and to collect information comprised in the detection pixel such as the intensity of charged particles.

The instructions may be configured to generate an image such as shown and described with reference to FIGS. 16 and 17. The instructions may process the information to calculate one or more corrections, optionally dependent on user input in response to the image. The calculations may relate to one more parameters of the set of parameters. The calculations may provide adjustments to one or more settings of the set of settings. The instructions may be configured to control, for example the controller 50, to adjust one or more settings of one or more charged particle components of the charged particle device 41. The controlled one or more charged particle components may comprise the source 201. The instructions may be configured to control the charged particle device 41 to optimize at least one of: the alignment of the sub-beams with the multi-beam arrangement with respect to each other, the alignment between two or more charged particle components of the charged particle device 41; the alignment between at least one of the charged particle components and the sub-beams of the multi beam arrangement; and the electron-optical performance of at least one of the components by applying a setting corresponding to an adjustment of one or more of the sub-beams of the charged particle multi-beam arrangement.

The image may be a graphical representation. The graphical image may be used for determining alignment of electron optical components operable on a plurality of beams of a beam grid in a charged particle apparatus for example as described in reference to and depicted in any of for example FIGS. 2, 3, 8 and 13. Such a charged particle apparatus may comprise an aperture array and a detector array. In the aperture array are defined a plurality of apertures. The detector may be configured to detect charged particles corresponding to the beams that pass through the apertures. The detector may be positioned downbeam of the aperture array. The graphical representation comprises a beam grid image of the beam grid based on a plurality of series of pixels derived from respective beams.

A series of pixels may correspond to a series of positions of the respective beam spaced at the intervals along a scanning path. The scanning path of the beam over the aperture array has a main scanning direction and a sub-scanning direction. The main scanning direction is different from the sub-scanning direction. The series of pixels of a respective beam is rendered into a beam image of the respective beam in the beam grid image. A beam image in the beam grid image may represent a respective beam in the beam grid. The beam image in the beam grid may be positioned in the beam grid image based on the position of the respective aperture in the aperture array. The beam image may correspond to a respective aperture in the aperture. The image such as the graphical representation may comprise information about a beam in the beam grid and/or the beam grid as a whole.

Such information obtainable from the image may comprise the following information in a non-limited list. Such information may comprise parameters of the parameter set. The relative position of the sub-beams with respect to the respective aperture of the aperture array of which the sub-beam is scanned. The relative position of the sub-beams with respect to each other for example in the plane of the aperture array over which they are scanned. Such information is useful for determining the alignment of the sub-beams with respect to each other in the multi-beam arrangement. One or more of the various types of alignment may be determined (for example between the multi-beam arrangement and another charged particle optical component up-beam of the array over which the multi-beam arrangement is scanned, two of the charged particle components). Parameters of each sub-beam such as their shape such as their ellipticity which may be representative of astigmatic aberrations of the respective source beam. The features of the sub-beams may correspond to characteristics may correspond to one or more parameters of the primary beam (or source beam). That is reviewing the features enables identification of one or more parameters of the primary charged particle beam and thus information about one or more parameters about the source beam. The one or more parameters of the sub-beams gathered in the information may relate to one or more other characteristics of the charged particle beam such as alignment, brightness, emission strength and/or source beam uniformity (such as the effective coverage of the multi-beam arrangement, the tilt and shift of the source beam relative to an aperture array from the multi-beam arrangement is generated, and the cross-sectional shape of the multi-beam arrangement). The one or more parameters of the source beam and/or at least a sub-beam of the multi-beam arrangement may relate to one or more aberrations such as distortion for example of a macroscopic lens.

Such a computer program may comprise instructions to instruct the controller 50 to perform the following steps. The controller 50 controls the charged particle beam apparatus 40 to project a charged particle beam towards the sample 208. In some embodiments, the controller 50 controls at least one charged particle-optical component (e.g. an array of multiple deflectors or scan deflectors 260) to operate on the charged particle beam in the charged particle beam path. Additionally or alternatively, in some embodiments, the controller 50 controls at least one charged particle-optical element (e.g. the detector 240) to operate on the charged particle beam emitted from the sample 208 in response to the charged particle beam. The controller may control charged particle components by controlling, for example adjusting, a setting of the set of settings.

The computer using the instructions may be provided at the charged particle apparatus or may be remote from the apparatus, such as in a different room.

The method of the embodiments of the present disclosure may alternatively be described as a method of generating a beam grid image for aligning electron optical components operable on a plurality of individual beams of a beam grid in a charged particle apparatus comprising: an aperture array 112 and a detector. The aperture array has a plurality of apertures 113. The detector is configured to detect charged particles associated with the beams that pass through the apertures. The detector is positioned downbeam of the aperture array. Such a method may comprise: scanning the individual beams of the beam grid over a respective portion of the aperture array D; detecting at intervals during the scanning charged particles associated with individual beams as respective series 710 of pixels 711, 712, the charged particles of an associated beam having passed through the associated aperture of the aperture array; and generating: a beam grid image 700 of the beam grid based on the respective series of pixels 710 derived from individual beams of the beam grid. The scanning comprises scanning the beams along a respective scanning path over the aperture array having a main scanning direction and a sub-scanning direction. The main scanning direction is different from the sub-scanning direction. The series of pixels associated with an individual beam is associated with a series of positions of the individual beam spaced at the intervals along the scanning path. The different respective series of pixels are rendered into beam images of different individual beams in the beam grid image.

The method may alternatively be described as a method of generating a beam grid image. The beam grid image is for aligning electron optical components operable on a plurality of beams of a beam grid in a charged particle apparatus comprising: an aperture array 112 and detector array. The aperture array has a plurality of apertures 113. The detector is configured to detect charged particles of the beams that pass through the apertures. The detector is positioned downbeam of the aperture array. The method comprises: scanning detecting and generating. The scanning comprising scanning beams of the beam grid over respective portions of the aperture array, the respective positions having an aperture of the aperture array. The detecting comprises detecting charged particles of the beams that pass through the apertures of the respective portions. The detecting of the beams is at intervals during the scanning as respective series 710 of pixels 711, 712. The generating is the generating of a beam grid image of the beam grid based on the respective series 710 of pixels derived from the beams of the beam grid.

The scanning comprises scanning the beams along a respective scanning path over the respective positions of the aperture array. The scanning path has a main scanning direction and a sub-scanning direction. The main scanning direction is different from the sub-scanning direction. The respective series of pixels correspond to respective series of positions of the beam spaced at the intervals along the scanning path. The respective series of pixels are rendered into beam images of the different beams in the beam grid image. The different beam images of the beam grid image represent different beams in the beam grid and correspond to a respective aperture in the aperture. The different beam images in the beam grid are positioned in the beam grid image based on the position of a respective aperture in the aperture array.

The method may be applied to a charged particle apparatus configured to project a single beam of charged particles towards a sample. Such a method of generating a beam image is for aligning electron optical components operable on a beam in a charged particle apparatus comprising: an aperture plate and a detector. In the aperture plate is defined an aperture 113. The detector is configured to detect charged particles corresponding to the beam that pass through the aperture. The detector is positioned downbeam of the aperture plate. The method comprises: scanning, detecting, and generating. The scanning comprising scanning the beam along a meandering path over a portion D of the aperture plate so that charged particles of the beam pass through the aperture. The detecting comprises detecting at intervals along the meandering path charged particles of the beam that pass through the aperture array as a series 710 of pixels 711, 712. The generating comprises generating the beam image of the beam based on the series of pixels derived from the beam.

The pixels are representative of at least the intensity of detected signal particles. A shape in the image represents a beam corresponding to the aperture in the aperture. A shape of the series of pixels is of the charged particle beam, desirably the pixels of the series being contiguous desirably to form the shape. The shape of the series of pixels correspond to an aperture in the aperture. A shape of the beam positioned in the beam image is based on the position of the aperture in the aperture plate.

Reference to a component or system of components or elements being controllable to manipulate or operate on a charged particle beam in a certain manner includes configuring a controller or control system or control unit to control the component to manipulate the charged particle beam in the manner described, as well as optionally using other controllers or devices (e.g. voltage supplies and/or current supplies) to control the component to manipulate the charged particle beam in this manner. For example, a voltage supply may be electrically connected to one or more components to apply potentials to the components, such as in a non-limited list including the control lens array 250, the objective lens array 234, the condenser lens 231, correctors, and scan deflector array 260, under the control of the controller or control system or control unit. An actuatable component, such as a stage, may be controllable to actuate and thus move relative to another components such as the beam path using one or more controllers, control systems, or control units to control the actuation of the component.

Any element or collection of elements may be replaceable or field replaceable within the electron optical apparatus 40. The one or more charged particle-optical components in the electron optical apparatus 40, especially those that operate on sub-beams or generate sub-beams, such as aperture arrays and manipulator arrays may comprise one or more MEMS elements for example a MEMS stack.

An assessment tool according to some embodiments of the present disclosure may be a tool which makes a qualitative assessment of a sample (e.g. pass/fail), one which makes a quantitative measurement (e.g. the size of a feature) of a sample or one which generates an image of map of a sample. Thus, the assessment tool could be any appropriate device, apparatus or system used for assessment. For example, the assessment tool could be any of the charged particle-optical device, e.g. as part of charged particle beam apparatus 40, or more specifically the charged particle-optical device 41 (which may be a charged particle-optical column), and/or as part of an optical lens array assembly, when used for assessment. Examples of assessment tools are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The charged particle beam device 41 (which may be a charged particle-optical column) may be a component of an assessment tool; such as an inspection tool or a metro-inspection tool, or part of an e-beam lithography tool. Any reference to a tool herein is intended to encompass a device, apparatus or system, the tool comprising various components which may or may not be collocated.

In any of the above examples, the device or apparatus may further comprise a source configured to emit at least one source beam from which the plurality of sub-beams are generated. The plurality of sub-beams may be generated from multiple sources, e.g. by using multiple columns.

The embodiments of the present disclosure can be applied to various different tool architectures. For example, the charged particle beam apparatus 40 may be a single beam tool or may comprise a plurality of single beam columns or may comprise a plurality of columns of multi-beams (i.e. sub-beams). The columns may comprise the charged particle optical device described in any of the above embodiments or aspects. As a plurality of columns (or a multi-column tool), the devices may be arranged in an array which may number two to one hundred columns or more. The charged particle device 41 may take the form of an example as described with respect to and depicted in FIG. 3 or as described with respect to and depicted in FIG. 8, although desirably having an electrostatic scan deflector array and/or an electrostatic collimator array for example in the objective lens array assembly. The charged particle optical device may be a charged particle optical column. A charged particle column may optionally comprise a source.

The term "image" is used herein to refer to a two-dimensional array of values. The image may be displayed by mapping the values to an intensity or color scale however, the use of the term image should not be taken as requiring that the array of values is displayed in that way nor represents anything that might be perceived by a person.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector.

References to up and low, upper and lower, lowest, up and down, above and below should be understood as referring to directions parallel to the (typically but not always vertical) upbeam and downbeam directions of the electron beam or multi-beam impinging on the sample 208. Thus, references to upbeam and downbeam are intended to refer to directions in respect of the beam path independently of any present gravitational field.

References to elements being aligned along a beam path or sub-beam path are understood to mean that the respective elements are positioned along the beam path or sub-beam path.

Exemplary embodiments are described below in the following clauses:

Clause 1: A method of determining alignment of electron optical components operable on a plurality of beamlets in a charged particle apparatus comprising: an aperture array and a detector configured to detect charged particles corresponding to the beamlets that pass through the corresponding apertures in the aperture array, the detector positioned downbeam along the paths of the beamlets relative to the aperture array, the method comprising: scanning each beamlet in a plane of the aperture array over a portion of the aperture array in which a corresponding aperture of the aperture array is defined so that charged particles of each beamlet may pass through the corresponding aperture; detecting during the scan any charged particles corresponding to each beamlet that passes through the corresponding aperture; generating a detection pixel for each beamlet based on the detection of charged particles corresponding to each beamlet at intervals of the scan; and collecting information comprised in the detection pixel such as the intensity of charged particles. Desirably the aperture array and optionally the detector are comprised in a charged particle device. The charged particle device comprised in the charged particle apparatus.

Clause 2: The method of clause 1, wherein the detecting comprises detecting any charged particles corresponding to each beamlet that pass through the corresponding aperture at the intervals during the scan.

Clause 3: The method of either of clauses 1 and 2, further comprising generating, for each beamlet, an image representative of the intensity of detected signal particles corresponding to the scan of the beamlet over the portion of the aperture array in which its corresponding aperture is defined, desirably the image comprises the collected information of each interval for the beamlet, desirably the portion comprises two or more apertures.

Clause 4: The method of clause 3 comprising generating, based on a plurality of the images for the plurality of beamlets, a combined image, representative of the scan of the plurality of beamlets over the aperture array, desirably over their respective portions of the aperture array in which the corresponding aperture is defined, desirably the combined image comprises the collected information of each interval for the plurality of beamlets, desirably all of the plurality of the beamlets, desirably the portion comprises two or more corresponding apertures, such that the respective portions overlap.

Clause 5: The method of clause 4, wherein the positions of the images represented in the combined image are determined based on the physical positions of the corresponding apertures in the aperture array.

Clause 6: The method of clause 4 or 5, wherein the distances between the images represented in the combined image are determined based on the relative positions of the corresponding apertures in the aperture array.

Clause 7: The method of any one of clauses 3 to 6, further comprising determining a parameter set of at least one beamlet relating to dimensions of the or each beamlet in a plane of the aperture array, based on the image corresponding to the or each beamlet.

Clause 8: The method of clause 7, wherein the parameter set comprises a shape of the or each beamlet in the plane of the aperture array.

Clause 9: The method of either of clauses 7 and 8, wherein the parameter set comprises one or more dimensions of the or each beamlet in the plane of the aperture array.

Clause 10: The method of any of clauses 7 to 9, wherein the parameter set comprises a characteristic of information of the detection pixels, for example a variation in the characteristic of the detection pixels, such as the variation in intensity of the detection pixels, desirably over the image, e.g., current/intensity of the detection pixels in the image as a function of position in the image.

Clause 11: The method of any of clauses 7 to 10, wherein the parameter set relates to a plurality of beamlets.

Clause 12: The method of clause 11, wherein the determining the parameter set comprises determining a plurality of individual beam parameter sets each relating to a single beamlet and generating the parameter set from the plurality of individual beam parameter sets or determining the parameter set from a combined image comprising detection pixels relating to multiple beamlets.

Clause 13: The method of either of clauses 11 and 12, wherein the parameter set comprises an alignment parameter set of the plurality of beamlets in the plane of the aperture array.

Clause 14: The method of clause 13, wherein the alignment parameter set comprises a beam pitch between two or more of the beamlets in the plane of the aperture array, desirably the beam pitch representative of all beamlets in the plane of the aperture array.

Clause 15: The method of either of clauses 13 and 14, wherein the alignment parameter set comprises the relative intensity, position and/or shape of the beamlets represented in the parameter set.

Clause 16: The method of any one of clauses 7 to 15, the charged particle apparatus having a set of settings, the method further comprising changing at least one setting of the set of settings based on the parameter set.

Clause 17: The method of clause 16, wherein the set of settings comprises a setting of an aberration corrector or a setting of a collimator.

Clause 18: The method of any of the preceding clauses, wherein the scanning comprises scanning each beamlet along a scanning path having a main scanning direction and a sub-scanning direction, desirably the main scanning direction is different from the sub-scanning direction, desirably the scanning path defines a scanning pattern in the plane of the aperture array.

Clause 19: The method of clause 18, wherein the scanning pattern is raster scanning pattern.

Clause 20: The method of either of clauses 18 and 19, the plurality of beamlets having a beam pitch, desirably in the plane of the aperture array, wherein the distance each beamlet is scanned over the corresponding portion of the aperture array in the main scanning direction is less than a number of beam pitches, such as less than or equal to the beam pitch.

Clause 21: The method of any one of clauses 18 to 20, wherein each detection pixel during the scanning of the portion corresponds to a position of the beamlet on the scanning path, desirably the detection pixel is of the image.

Clause 22: The method of any of the preceding clauses, wherein the detecting is performed simultaneously for a plurality of beamlets.

Clause 23: The method of clause 22, wherein the detecting is performed simultaneously for all of the beamlets projected through the aperture array.

Clause 24: The method of any of the preceding clauses, wherein the detector comprises a detector plate disposed downbeam of the aperture array.

Clause 25: The method of clause 24, wherein the detector plate is disposed on a stage configured to support a sample.

Clause 26: The method of clause 25, wherein the detector plate comprises a scintillator.

Clause 27: The method of clause 26, wherein the detector comprises a photonic detector disposed downbeam of the scintillator.

Clause 28: The method of any one of clauses 1 to 23, wherein the detector comprises a charged particle detector array disposed downbeam of the aperture array.

Clause 29: The method of clause 28, wherein the detector is an electron optical component of the charged particle apparatus.

Clause 30: The method of any preceding clause, the electron optical components of the charged particle apparatus further comprising an additional aperture array disposed along and upbeam the paths of the beamlets relative to the aperture array, the method further comprising directing the plurality of beamlets through the additional aperture array disposed upbeam of the aperture array towards the aperture array, the scanning desirably comprising directing the beamlets through the corresponding apertures in the aperture array.

Clause 31: The method of clause 30, wherein determining alignment of one or more of the electron optical components relative to the aperture array based on the collected information, desirably the additional aperture array.

Clause 32: The method of either of clauses 30 and 31, wherein the additional aperture array comprises at least one of: a beam-limiting aperture array for generating or shaping the aperture array, a corrector array; a lens array or any other aperture array.

Clause 33: The method of any preceding clause, wherein the charged particle apparatus comprises a further aperture array positioned downbeam in the paths of the beamlets from the aperture array.

Clause 34: The method of any preceding clause, wherein the scanning is performed by deflecting each beamlet, desirably the deflecting is by a deflector upbeam of the aperture array, desirably downbeam of the additional aperture array.

Clause 35: A method of generating a beam grid image for aligning electron optical components operable on a plurality of individual beams of a beam grid in a charged particle apparatus comprising: an aperture array having a plurality of apertures and a detector configured to detect charged particles associated with the beams that pass through the apertures, the detector positioned downbeam of the aperture array, the method comprising: scanning the individual beams of the beam grid over a respective portion of the aperture array; detecting at intervals during the scanning charged particles associated with individual beams as respective series of pixels, the charged particles of an associated beam having passed through the associated aperture of the aperture array; and generating: a beam grid image of the beam grid based on the respective series of pixels derived from individual beams of the beam grid.

Clause 36: The method of clause 35, wherein the scanning comprises scanning the beams along a respective scanning path over the aperture array having a main scanning direction and a sub-scanning direction, desirably the main scanning direction being different from the sub-scanning direction, desirably the series of pixels associated with an individual beam associated with a series of positions of the individual beam spaced at the intervals along the scanning path, desirably the different respective series of pixels rendered into beam images of different individual beams in the beam grid image.

Clause 37: A method of generating a beam grid image for aligning electron optical components operable on a plurality of beams of a beam grid in a charged particle apparatus comprising: an aperture array having a plurality of apertures and a detector configured to detect charged particles of the beams that pass through the apertures, the detector positioned downbeam of the aperture array, the method comprising: scanning beams of the beam grid over respective portions of the aperture array, the respective positions having an aperture of the aperture array; detecting charged particles of the beams that pass through the apertures of the respective portions, the detecting of the beams being at intervals during the scanning as respective series of pixels; and generating: a beam grid image of the beam grid based on the respective series of pixels derived from the beams of the beam grid.

Clause 38: The method of clause 37, wherein the scanning comprises scanning the beams along a respective scanning path over the respective positions of the aperture array, the scanning path having a main scanning direction and a sub-scanning direction, the main scanning direction being different from the sub-scanning direction, the respective series of pixels corresponding to respective series of positions of the beam spaced at the intervals along the scanning path, the respective series of pixels rendered into beam images of the different beams in the beam grid image.

Clause 39: The method of clause 37 or 38, wherein the different beam images of the beam grid image representing different beams in the beam grid and corresponding to a respective aperture in the aperture, wherein the different beam images in the beam grid is positioned in the beam grid image based on the position of a respective aperture in the aperture array.

Clause 40: A method of generating a beam image for aligning electron optical components operable on a beam in a charged particle apparatus comprising: an aperture plate in which is defined an aperture and a detector configured to detect charged particles corresponding to the beam that pass through the aperture, the detector positioned downbeam of the aperture plate, the method comprising: scanning the beam along a meandering path over a portion of the aperture plate so that charged particles of the beam pass through the aperture; detecting at intervals along the meandering path charged particles of the beam that passes through the aperture array as a series of pixels; and generating: the beam image of the beam based on the series of pixels derived from the beam.

Clause 41: The method of clause 40, wherein the pixels are representative of at least the intensity of detected signal particles.

Clause 42: The method of clause 40 or 41, a shape of the series of pixels being the charged particle beam and corresponding to an aperture in the aperture, wherein a shape of the beam positioned in the beam image is based on the position of the aperture in the aperture plate.

Clause 43: A computer program comprising instructions configured to control a charged particle tool to perform the method of any of the preceding clauses.

Clause 44: A computer program comprising instructions for determining alignment of electron optical components operable on a plurality of beamlets in a charged particle apparatus comprising: an aperture array and a detector configured to detect charged particles corresponding to the beamlets that pass through the corresponding apertures in the aperture array, the detector positioned downbeam along the paths of the beamlets relative to the aperture array, the computer program comprising instructions configured to: control the charged particle apparatus to scan each beamlet in a plane of the aperture array over a portion of the aperture array in which a corresponding aperture of the aperture array is defined so that charged particles of each beamlet may pass through the corresponding aperture; control the charged particle apparatus to detect during the scan any charged particles corresponding to each beamlet that passes through the corresponding aperture, generate a detection pixel for each beamlet based on the detection of charged particles corresponding to each beamlet at intervals of the scan; and collect information comprised in the detection pixel such as the intensity of charged particles.

Clause 45: A graphical representation for determining alignment of electron optical components operable on a plurality of beams of a beam grid in a charged particle apparatus that comprises: an aperture array in which are defined a plurality of apertures and a detector configured to detect charged particles corresponding to the beams that pass through the apertures, the detector positioned downbeam of the aperture array, the graphical representation comprising: a beam grid image of the beam grid based on a plurality of series of pixels derived from respective beams.

Clause 46: The graphical representation of clause 45, wherein a series of pixels corresponding to a series of positions of the respective beam spaced at the intervals along a scanning path.

Clause 47: The graphical representation of clause 46, wherein the scanning path of a beam over the aperture array has a main scanning direction and a sub-scanning direction, the main scanning direction being different from the sub-scanning direction, Clause 48: The graphical representation of any of clauses 45 to 47, wherein the series of pixels of a respective beam is rendered into a beam image of the respective beam in the beam grid image.

Clause 49: The graphical representation of any of clauses 45 to 48, wherein a beam image in the beam grid image representing a respective beam in the beam grid and corresponding to a respective aperture in the aperture, wherein a beam image in the beam grid is positioned in the beam grid image based on the position of the respective aperture in the aperture array.

While the embodiments of the present disclosure have been described in connection with various examples, other embodiments will be apparent to those skilled in the art from consideration of the specification and practice of the technology disclosed herein. It is intended that the specification and examples be considered as exemplary only, with a true scope and spirit of the invention being indicated by the following claims and clauses herein.

The invention claimed is:

1. A method of determining alignment of electron optical components operable on a plurality of beamlets in a charged particle apparatus comprising: an aperture array and a detector configured to detect charged particles corresponding to the beamlets that pass through the corresponding apertures in the aperture array, the detector positioned downbeam along the paths of the beamlets relative to the aperture array, the method comprising:

scanning each beamlet in a plane of the aperture array over a portion of the aperture array in which a corresponding aperture of the aperture array is defined so that charged particles of each beamlet may pass through the corresponding aperture;

detecting during the scan any charged particles corresponding to each beamlet that passes through the corresponding aperture;

generating a detection pixel for each beamlet based on the detection of charged particles corresponding to each beamlet at intervals of the scan;

collecting information comprised in the detection pixel such as the intensity of charged particles;

generating, for each beamlet, an image representative of the intensity of detected signal particles corresponding to the scan of the beamlet over the portion of the aperture array in which its corresponding aperture is defined; and determining a parameter set of at least one beamlet relating to dimensions of the at least one beamlet in a plane of the aperture array, based on the image corresponding to the at least one beamlet.

2. The method of claim 1, wherein the detecting comprises detecting any charged particles corresponding to each beamlet that pass through the corresponding aperture at the intervals during the scan.

3. The method of claim 1, further comprising generating, based on a plurality of the images for the plurality of beamlets, a combined image, representative of the scan of the plurality of beamlets over the aperture array.

4. The method of claim 3, wherein the combined image comprises the collected information of each interval for the plurality of beamlets.

5. The method of claim 3, wherein the positions of the images represented in the combined image are determined based on the physical positions of the corresponding apertures in the aperture array.

6. The method of claim 3, wherein the distances between the images represented in the combined image are determined based on the relative positions of the corresponding apertures in the aperture array.

7. The method of claim 1, wherein the parameter set comprises a shape of the at least one beamlet in the plane of the aperture array and/or one or more dimensions of the at least one beamlet in the plane of the aperture array.

8. The method of claim 1, wherein the parameter set comprises a characteristic of information of the detection pixels, for example a variation in the characteristic of the detection pixels, such as the variation in intensity of the detection pixels.

9. The method of claim 1, wherein the parameter set relates to a plurality of beamlets.

10. The method of claim 9, wherein the determining the parameter set comprises determining a plurality of individual beam parameter sets each relating to a single beamlet and generating the parameter set from the plurality of individual beam parameter sets or determining the parameter set from a combined image comprising detection pixels relating to multiple beamlets.

11. The method of claim 9, wherein the parameter set comprises an alignment parameter set of the plurality of beamlets in the plane of the aperture array.

12. The method of claim 11, wherein the alignment parameter set comprises the relative intensity, position and/or shape of the beamlets represented in the parameter set.

13. The method of claim 1, wherein the charged particle apparatus has a set of settings, the method further comprising changing at least one setting of the set of settings based on the parameter set.

14. The method of claim 1, wherein the scanning comprises scanning each beamlet along a scanning path having a main scanning direction and a sub-scanning direction, the main scanning direction being different from the sub-scanning direction.

15. The method of claim 14, wherein the plurality of beamlets having a beam pitch in the plane of the aperture array, wherein the distance each beamlet is scanned over the corresponding portion of the aperture array in the main scanning direction is less than a number of beam pitches.

16. The method of claim 1, wherein the electron optical components of the charged particle apparatus further comprising an additional aperture array disposed along and upbeam the paths of the beamlets relative to the aperture array, the method further comprising:

directing the plurality of beamlets through the additional aperture array disposed upbeam of the aperture array towards the aperture array, wherein the scanning comprises directing the beamlets through the corresponding apertures in the aperture array.

17. A non-transitory computer readable medium that stores a set of instructions for determining alignment of electron optical components operable on a plurality of beamlets in a charged particle apparatus comprising: an aperture array and a detector configured to detect charged particles corresponding to the beamlets that pass through the corresponding apertures in the aperture array, the detector positioned downbeam along the paths of the beamlets relative to the aperture array, the set of instructions configured to cause one or more processors of the charged particle apparatus to perform operations comprising:

control the charged particle apparatus to scan each beamlet in a plane of the aperture array over a portion of the aperture array in which a corresponding aperture of the aperture array is defined so that charged particles of each beamlet may pass through the corresponding aperture;

control the charged particle apparatus to detect during the scan any charged particles corresponding to each beamlet that passes through the corresponding aperture;

generate a detection pixel for each beamlet based on the detection of charged particles corresponding to each beamlet at intervals of the scan;

collect information comprised in the detection pixel such as the intensity of charged particles;

generating, for each beamlet, an image representative of the intensity of detected signal particles corresponding to the scan of the beamlet over the portion of the aperture array in which its corresponding aperture is defined; and determining a parameter set of at least one beamlet relating to dimensions of the at least one beamlet in a plane of the aperture array, based on the image corresponding to the at least one beamlet.

\* \* \* \* \*